United States Patent [19]

Bendall et al.

[11] Patent Number: 4,727,324

[45] Date of Patent: Feb. 23, 1988

[54] METHOD AND APPARATUS FOR OBTAINING NUCLEAR MAGNETIC RESONANCE SPECTRA

[76] Inventors: Max R. Bendall, 274 Ford Road, Burbank 4123, Queensland; David T. Pegg, 7 Fanfare Street, Eight Mile Plains 4123, Queensland, both of Australia

[21] Appl. No.: 769,269

[22] Filed: Jul. 29, 1985

[30] Foreign Application Priority Data

Jul. 31, 1984 [GB] United Kingdom ............... 8419476

[51] Int. Cl.$^4$ ............................................. G01R 33/20
[52] U.S. Cl. ..................................... 324/309; 324/307
[58] Field of Search ................ 324/309, 307, 311, 314

[56] References Cited

U.S. PATENT DOCUMENTS

| | | | |
|---|---|---|---|
| 4,443,761 | 4/1984 | Levitt | 324/311 |
| 4,486,709 | 12/1984 | Bendall | 324/314 |
| 4,528,509 | 7/1985 | Radda et al. | 324/309 |

OTHER PUBLICATIONS

M. R. Bendall et al., Theoretical Description of Depth Pulse Sequences, On and Off Resonance, Including Improvements and Extensions Thereof, Mag. Res. in Medicine, vol. 2, No. 2, Apr. 1985, pp. 91–113.

Primary Examiner—Stewart J. Levy
Assistant Examiner—Scott M. Oldham
Attorney, Agent, or Firm—Cushman, Darby & Cushman

[57] ABSTRACT

A method of obtaining a localized nuclear magnetic resonance signal from a sample using a radiofrequency irradiation coil which provides an inhomogeneous radiofrequency field, comprises applying to the sample a plurality of radiofrequency pulse sequences, each pulse sequence including an excitation pulse, and at least two other pulses, the pulse sequences differing only in the phase of one or more of the said other pulses, and the phases of at least two of the said other pulses being shifted by 180° in selected sequences of the said plurality, the number of sequences in the said plurality being such that a sequence exists for each possible combination of the said phase shifts for each of the said other pulses, and there being no sequences in the said plurality in which the phases of the said at least two of the said other pulses is shifted by 90°, acquiring an N.M.R. signal after each pulse sequence, and combining the N.M.R. signals obtained to produce a localized N.M.R. signal from selected regions of the sample.

The method may be used in any N.M.R. method in which localization is desired.

23 Claims, 7 Drawing Figures

METHOD AND APPARATUS FOR OBTAINING NUCLEAR MAGNETIC RESONANCE SPECTRA

BACKGROUND OF THE INVENTION

This invention relates to nuclear magnetic resonance.

In recent times, a great deal of effort has been concentrated in methods of obtaining N.M.R. spectra from localized regions in space. Such methods are of particular interest in in vivo spectroscopy. A number of methods have been proposed, involving the application of field gradients, in combination with various sequences of Rf pulses. Such methods are in part successful, but suffer from the disadvantage that the resolution of the spectra obtained tends to be degraded by the use of the gradients.

A number of proposals have been made for localizing N.M.R. spectra, without the use of field gradients. For example, a method has been proposed by M. R. Bendall, (U.S. Pat. No. 4,486,709) and a further paper by M. R. Bendall (Journal of Magnetic Resonance, 59, 406–409, (1984)) involving the use of a sequence of pulses of different amplitudes, and phases. For example, three pulses may be used before each signal acquisition, having pulse angles of $2\theta$, $\theta$, $2\theta$ respectively and the experiment is repeated for various combinations of the phase of the first and third pulses, specifically, with phase shifts of 180° applied to the first pulse, and of 90°, 180°, and 270° are applied to the third pulse. The signals obtained from the eight individual signal acquisitions carried out with the various combinations of these phase shifts are then averaged with appropriate inversion of the receiver phase, and it is found that the signal obtained from various parts of the sensitive region of the receiving coil cancel, so that the actual signal sensed by the receiving coil is from a region localized in space.

The shorthand notation used to indicate the eight pulses in this sequence is as follows:

$$2\theta[\pm x];\ \theta;\ 2\theta[\pm x, \pm y]$$

where $\theta$ represents an arbitrary pulse angle of the Rf pulse used, ± indicates that the corresponding pulse is repeated with a 180° phase shift, and ±x±y indicates that the corresponding pulse is repeated with the three 90° phase shifts (ie four pulses in all). When the phase of the third pulse is ±y, the resulting signal is subtracted from the average, i.e. the receiver phase is inverted. Pulse sequences of this kind are referred to herein as "depth" pulse sequences.

The basis of depth pulse schemes has been previously described and the prior art is summarised in the above-mentioned prior art.

We have now devised a number of further techniques and apparatus related to those disclosed in the publication referred to above, and have undertaken a theoretical analysis to enable further useful pulse sequences to be predicted.

As described in the above publications, depth pulse sequences were introduced to enable multipulse methods, such as inversion-recovery $T_1$ and spin-echo techniques, to be applied with inhomogeneous rf coils, in particular surface coils, and to enable at least partial localization of the sample region from which NMR signals can be detected, i.e. the sample sensitive volume. Complete localization of the sample sensitive volume can be achieved using static or pulsed magnetic field gradients in combination with depth pulses, or by using separate transmitter and receiver coils, or multiple transmitter coils, in combination with depth pulse sequences (M. R. Bendall, J. M. McKendry, I. D. Cresshull, and R. J. Ordidge, Journal of Magnetic Resonance, 60, 473, 1984)). Phase cycled pulse schemes also enable the major types of heteronuclear multipulse NMR to be used in conjunction with inhomogeneous Rf coils separately from, or in combination with, sample localization (M. R. Bendall and D. T. Pegg, Journal of Magnetic Resonance 57, 337 (1984)). In all cases these methods can be combined with NMR imaging methods. The major area of application is in in vivo spectroscopy, and in summary, depth pulse schemes are quite comprehensive in their applicability and are poised to make an important contribution to the development of in vivo spectroscopy.

Two equivalent forms of depth sequences are disclosed, which may be described, using the above notation, as $$2\theta;\ \theta[\pm x];\ (2\theta[\pm x, \pm y])_n;\ \text{acquire signal} \qquad [1]$$

and $$2\theta[\pm x];\ \theta;\ (2\theta[\pm x, \pm y])_n;\ \text{acquire signal} \qquad [2]$$

The present invention is concerned only with the second form and in the following description of the present invention several simple conventions will be used.

Only one pulse in a depth pulse sequence permits conversion of initial z magnetization to detectable transverse magnetization. This is called the excitation pulse and is given a variable angle to signify the existence of Rf inhomogeneity. In sequence [1] above, the excitation pulse is the $\theta[\pm x]$ pulse, but in sequence [2], and in all other depth pulse schemes described herein, the excitation pulse $\theta$ is recognizable as the only pulse whose phase is not cycled. The excitation pulse may be of arbitrary phase, but its phase will be represented hereinafter as x. Pulses having a magnitude of fractions, or multiples of $\theta$ may be used for specific purposes.

There are two major types of phase-cycled pulses which may be combined with the excitation pulse in a depth pulse scheme. The two types may be denoted, as first indicated above, as $A[\pm x]$ and $A[\pm x, \pm y]$, where A indicates the pulse angle, which will normally be some multiple or fraction of the excitation pulse angle $\theta$ (for example $2\theta$) and $[\pm x]$ and $[\pm x, \pm y]$ signify that the respective pulse is repeated in successive sequences with the defined phase variations. Receiver phase inversion is normally used whenever an odd number of ±y pulse phases is employed. The magnitudes of these pulses are commonly, as indicated above, $2\theta$. Fractions or multiples of $2\theta[\pm x]$ such as $\theta/3[\pm x]$ and $4\theta[\pm x]$ may alternatively be utilized. However such variations will be referred to as being "$2\theta[\pm x]$) type" pulses, and are covered by the following theory for $2\theta[\pm x]$.

In expressions such as $(2\theta[\pm x, \pm y])_n$, n signifies a succession of n $2\theta[\pm x, \pm y]$ pulses.

In the prior art described above, depth pulse schemes contribute to sample localization by limiting the detection of NMR signals to sample regions where the pulse angle $\theta$ in the depth pulse sequence is between 90°±45°, between 270°±45°, between 450°±45°, between 630°±45° and so on. Outside these regions, detected signal intensity is reduced to a few percent (say <4%) of normal. The prior art also discloses that signal from regions where $\theta$ is between $270° \pm 45°$ and between $450° \pm 45°$ (i.e. "high flux" signals) can substantially be eliminated on-resonance.

SUMMARY OF THE INVENTION

In a first aspect of this invention, there is provided a method of obtaining a localized nuclear magnetic resonance signal from a sample using a radiofrequency irradiation coil which provides an inhomogeneous radiofrequency field, comprising the following steps:

applying to the sample a plurality of radiofrequency pulse sequences, each pulse sequence including at least one excitation pulse (in example 2 above, the $\theta$ pulse), and at least two localization pulses (in example 2 above, the $2\theta[\pm X]$ and the $2\theta[\pm X, \pm Y]$ pulses, respectively), the pulse sequences differing only in the phase of one or more of the localization pulses. The phases of corresponding localization pulses in the pluralities of pulse sequences being the same or differing by phase shifts of integral multiples of 90°. However, there must exist at least two pairs of pulse sequences in the plurality of sequences which differ only in that the phase of a selected pulse for the second sequence in the pair is shifted by 180° with respect to the corresponding pulse for the first pulse sequence of the pair. There are no sequences in the said plurality of sequences in which the phase of the pulse corresponding to the said selected pulse is shifted by 90° with respect to the phase of the corresponding pulse for the first sequence of each of the pairs. The number of pulse sequences in the plurality of sequences being such that a sequence exists for each possible combination of the said 180° phase shifts for each of the said other pairs of localization pulses, and for each phase shift selected from the group consisting of 0°, 90°, 180°, and 270°, for any pulse of the sequence for which a pair of sequences exist which sequences differ in that the phase of the respective pulses differs by 90°;

acquiring an N.M.R. signal after each pulse sequence;

and combining the N.M.R. signals obtained to produce a localised N.M.R. signal from selected regions of the sample.

In a second aspect of the invention, there is provided a method of obtaining a localized nuclear magnetic resonance signal from a sample using a radiofrequency irradiation coil which provides an inhomogeneous radiofrequency field, which method comprises:

applying to the sample a plurality of radiofrequency pulse sequences, each pulse sequence including an excitation pulse, and at least one localization other pulse or pulses. The pulse sequences differing only in the phase or absence of one or more of the said localization other pulses. The phases of corresponding pulses between the said pluralities of sequence being the same or differing by phase shifts of integral multiples of 90° wherein there exists three pulse sequence in the plurality of sequences which differ only in that in one of the said three sequence a selected pulse phase is shifted by 180° with respect to a second sequence of the said three sequences. In the third sequence of the said three sequences, the said selective pulse is omitted. The number of sequences in the said plurality being such that a sequence exists for each possible combination of the said phase shifts for each of the said localization pulses;

acquiring an N.M.R. signal after each pulse sequence;

and combining the N.M.R. signals obtained to produce a localized N.M.R. signal from selected regions of the sample.

In yet a further aspect, there is provided, a method of obtaining a localized nuclear magnetic resonance signal from a sample using a radiofrequency irradiation coil which provides an inhomogeneous radiofrequency field, comprising:

applying to the sample a plurality of radiofrequency pulse sequences, each pulse sequence including at least one localization pulse and a plurality of excitation pulses. The $n^{th}$ excitation pulse having a magnitude of $(2n-1)$ times that of the first excitation pulse;

acquiring an N.M.R. signal after each pulse sequence, and combining the N.M.R. signals obtained to produce a localized N.M.R. signal from selected regions of the sample.

At least in its preferred embodiments, this invention permits the pulse angle limits from within which signals may be detected to be reduced from $90° \pm 45°$ etc. to, say, $90° \pm 10°$ etc, thus providing better discrimination against unwanted sample regions.

The invention is also helpful in lowering or eliminating high flux signals both on-resonance and off-resonance.

In accordance with the first aspect of the invention more than one $A[\pm x]$ type pulse is utilized in a depth pulse scheme. This type of pulse may be utilized in various ways. For example, fractions or multiples of $2\theta[\pm x]$ are useful.

Another important variation in accordance with the second aspect of the invention is to apply $2\theta[\pm x]$ in a depth pulse sequence for a complete cycle of pulse sequences or so-called "transients", and then subtract the result obtained by omitting the $2\theta[\pm x]$ pulse from the sequence for an equal number of transients (a procedure we will abbreviate as $2\theta[\pm x, \overline{O}]$).

In accordance with the third aspect of the invention, Fourier series of excitation pulses of the form $\theta, 3\theta, 5\theta...$ are applied.

BRIEF DESCRIPTION OF THE DRAWINGS

Certain theoretical aspects, and a number of presently preferred practical embodiments of the invention are illustrated in the accompanying drawings, in which.

DETAILED DESCRIPTION OF THE PRESENTLY PREFERRED EMBODIMENTS

Figure 1:
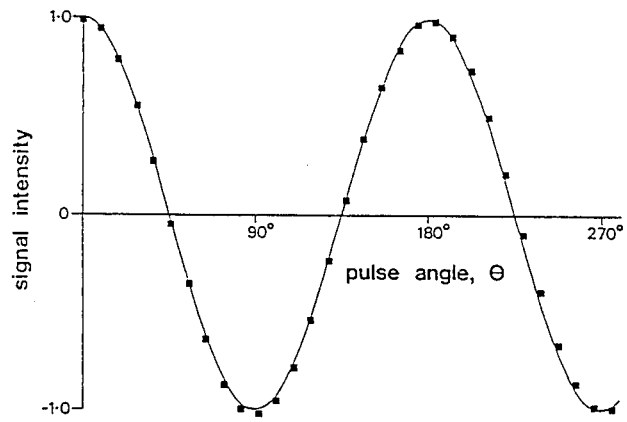
FIGS. 1 and 3 each are an experimentally obtained plot of pulse angle against signal intensity.

Referring to the drawings in more detail,

FIG. 1 is an experimentally obtained graph of the dependence of signal intensity on pulse angle for the sequence $\pi/2$; $2\theta[\pm x]$; acquire (applied on-resonance). Experimental points were obtained at incremented values of $\theta$ using a 10 mm diameter, 2 mm thick disc-shaped $H_2O$ phantom at the center of, and coplanar with, a 70 mm diameter surface coil. The curve is theoretical for $\cos 2\theta$.

Figure 2:
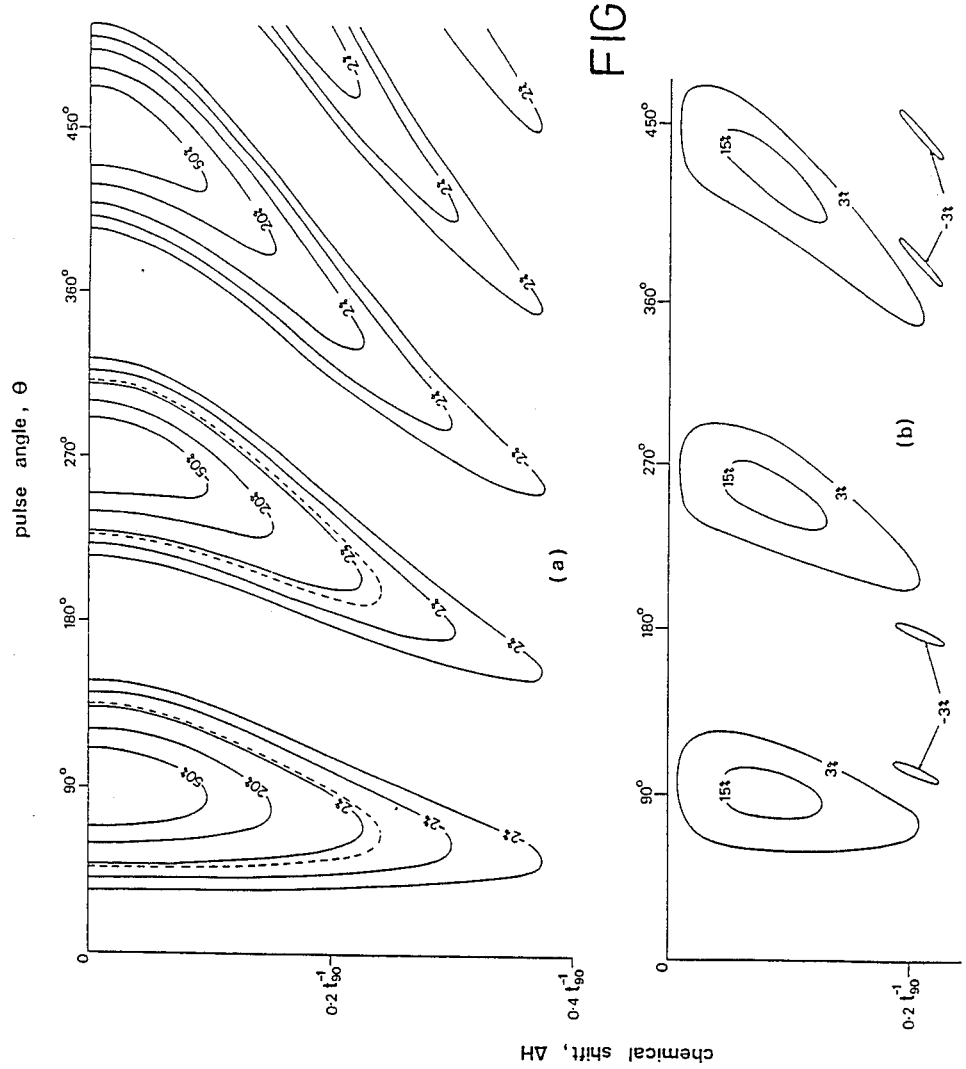
FIGS. 2, 4, 5 and 6 are theoretical magnetization contour plots.

FIG. 2 shows theoretical contour plots of (a) detectable y magnetization $I_y{}^f$, and (b) detectable x magnetization $I_x{}^f$, as a function of $\theta$ pulse angle and chemical shift off-resonance, $\Delta H$ for sequence [E]. The contours are percentages of the maximum detectable magnetization on-resonance at $\theta = 90°$. Actual off-resonance shifts in Hz are obtainable by multiplying the units given by the actual on-resonance 90° pulse time in seconds for a particular point in sample space. The dashed curves provided for the 90° and 270° regions in (a) exemplify the zero intensity contour which surrounds each signal region.

Figure 3:
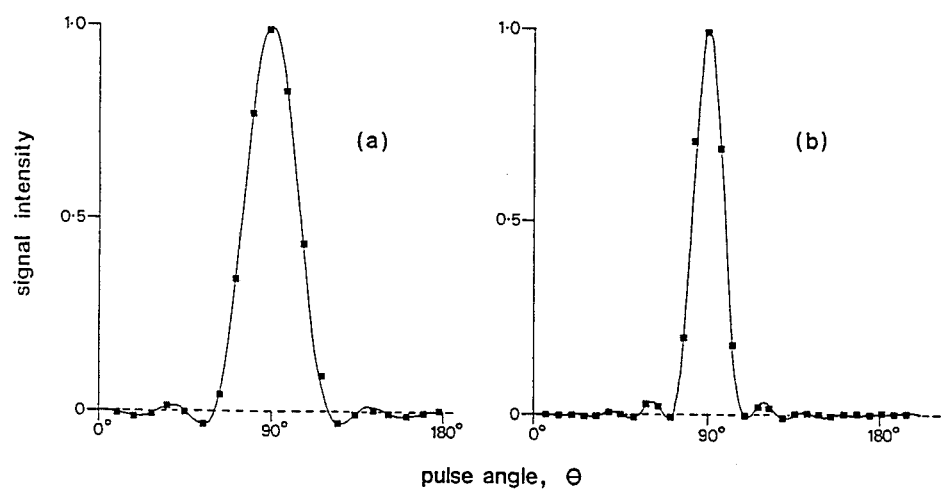

FIG. 3 shows the dependence of signal intensity on-resonance as a function of pulse angle $\theta$ for (a) sequence [H], and (b) sequence [J]. Experimental measurements were achieved as described for the FIG. 1 results. The curves are theoretical for ($\frac{1}{3}$) cos $2\theta$ (sin $\theta$ − sin $3\theta$ + sin $5\theta$) sin$^2\theta$ and (1/5) cos $2\theta$ cos $4\theta$ (sin $\theta$ − sin $3\theta$ + sin $5\theta$ − sin $7\theta$ + sin $9\theta$) sin$^2\theta$ respectively.

Figure 4:
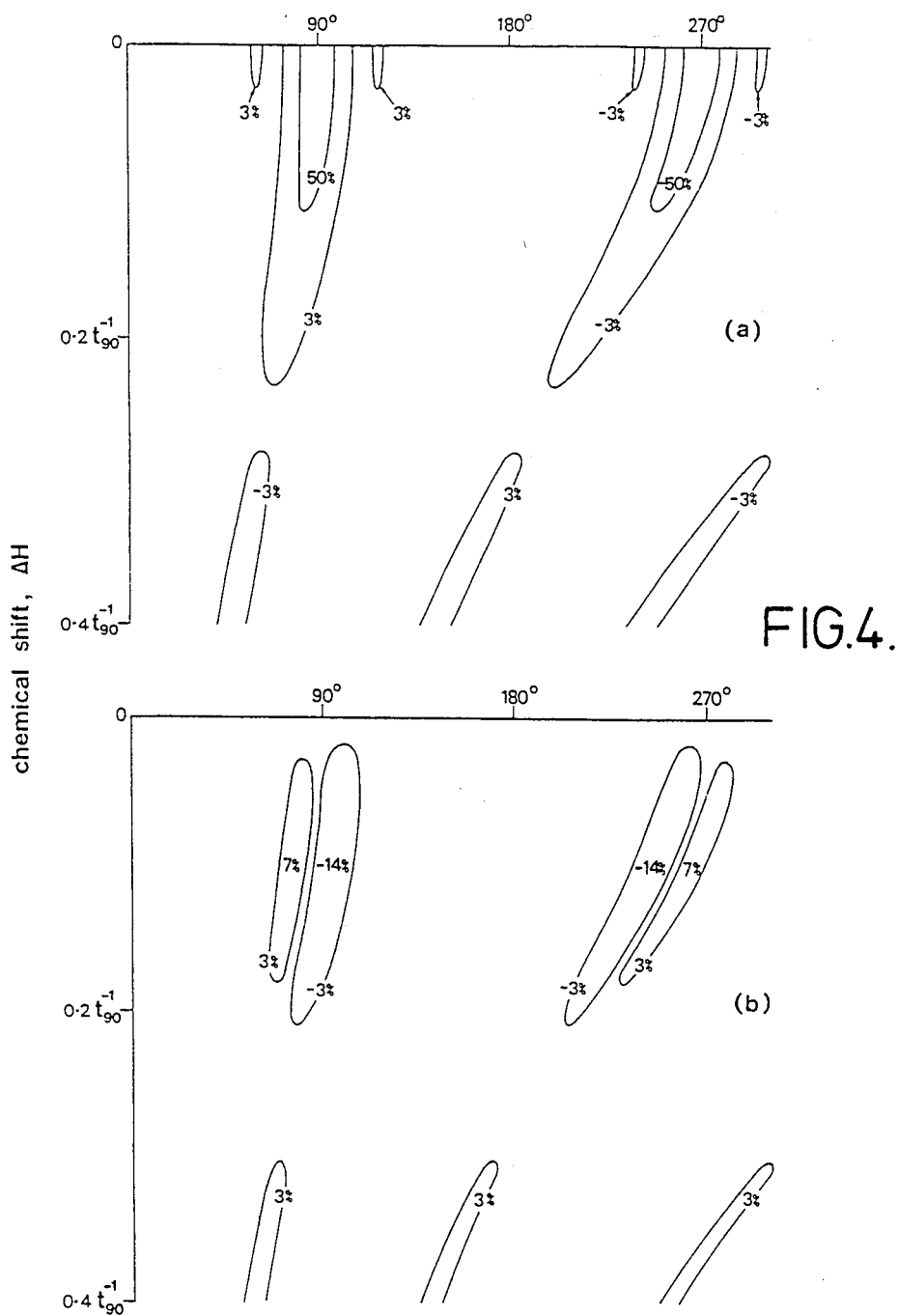

FIG. 4 shows theoretical contour plots as a function of $\theta$ and $\Delta H$ for (a) $I_y{}^f$ and (b) $I_x{}^f$ for scheme [J]. The 7% and −14% figures in 4(b) indicate positive and negative maximums at their approximate positions.

Figure 5:
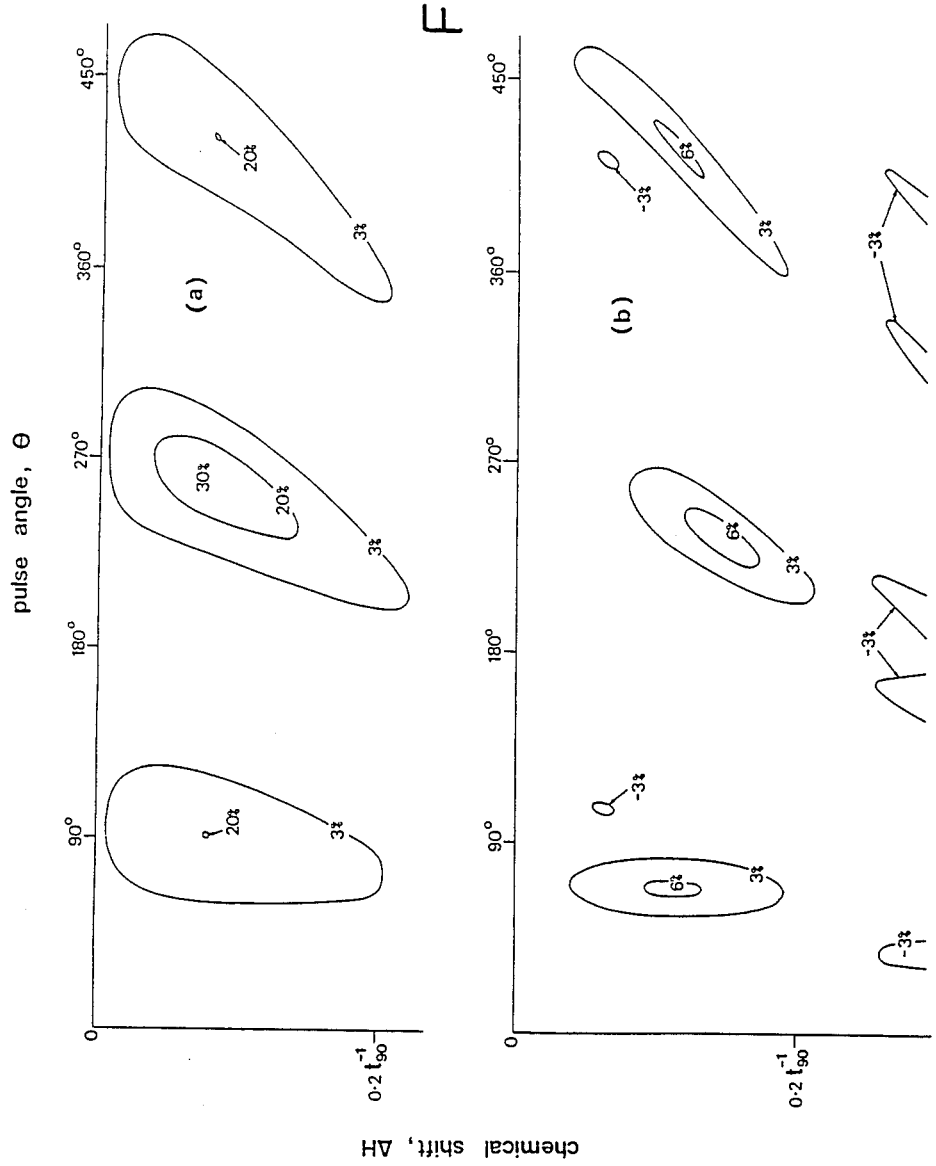

FIG. 5 shows theoretical contour plots of detectable dispersion magnetization $I_x{}^f$ as a function of $\theta$ and $\Delta H$ for (a) sequence [N] and (b) sequence [P].

Figure 6:
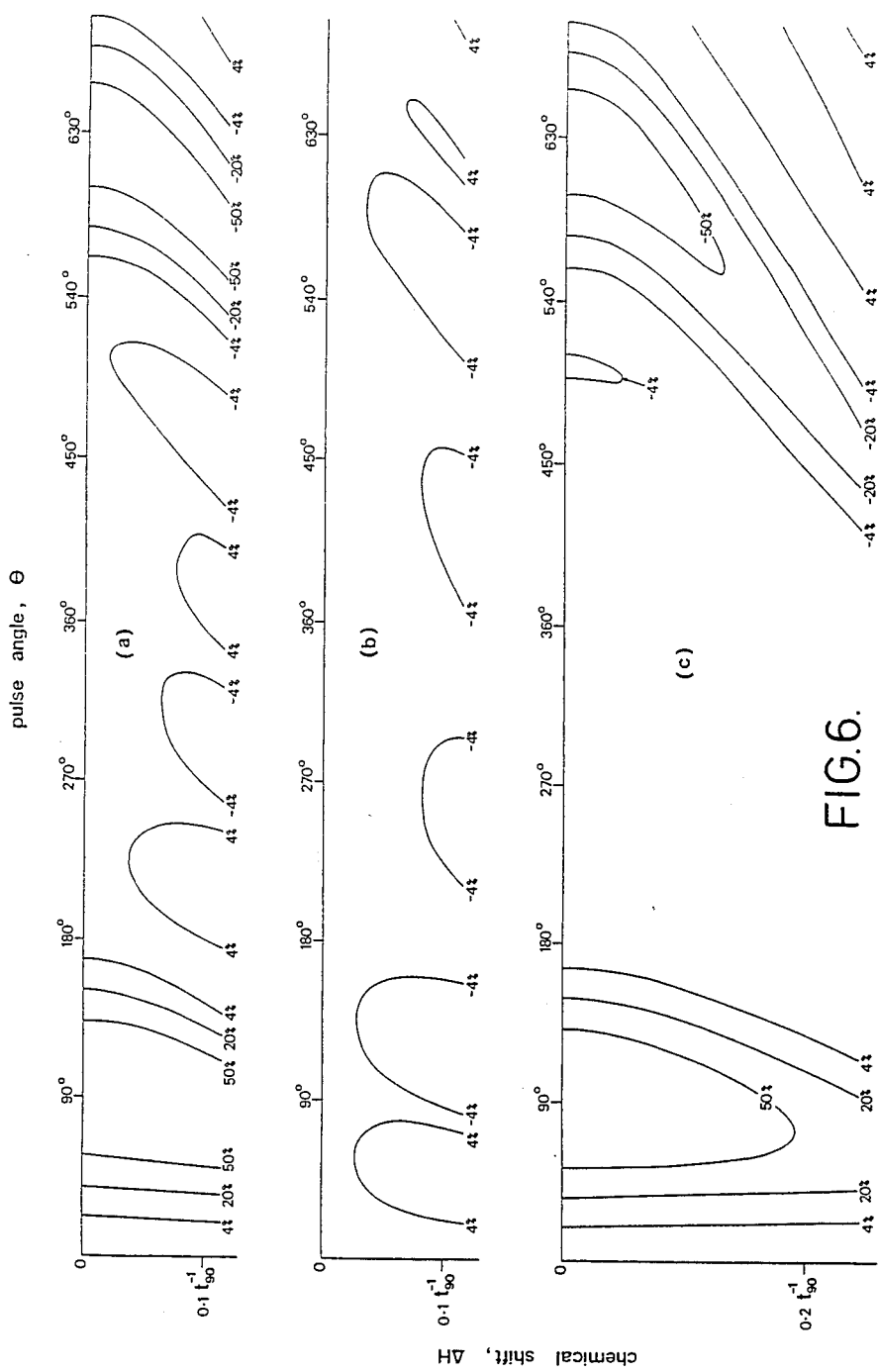
Figure 7:
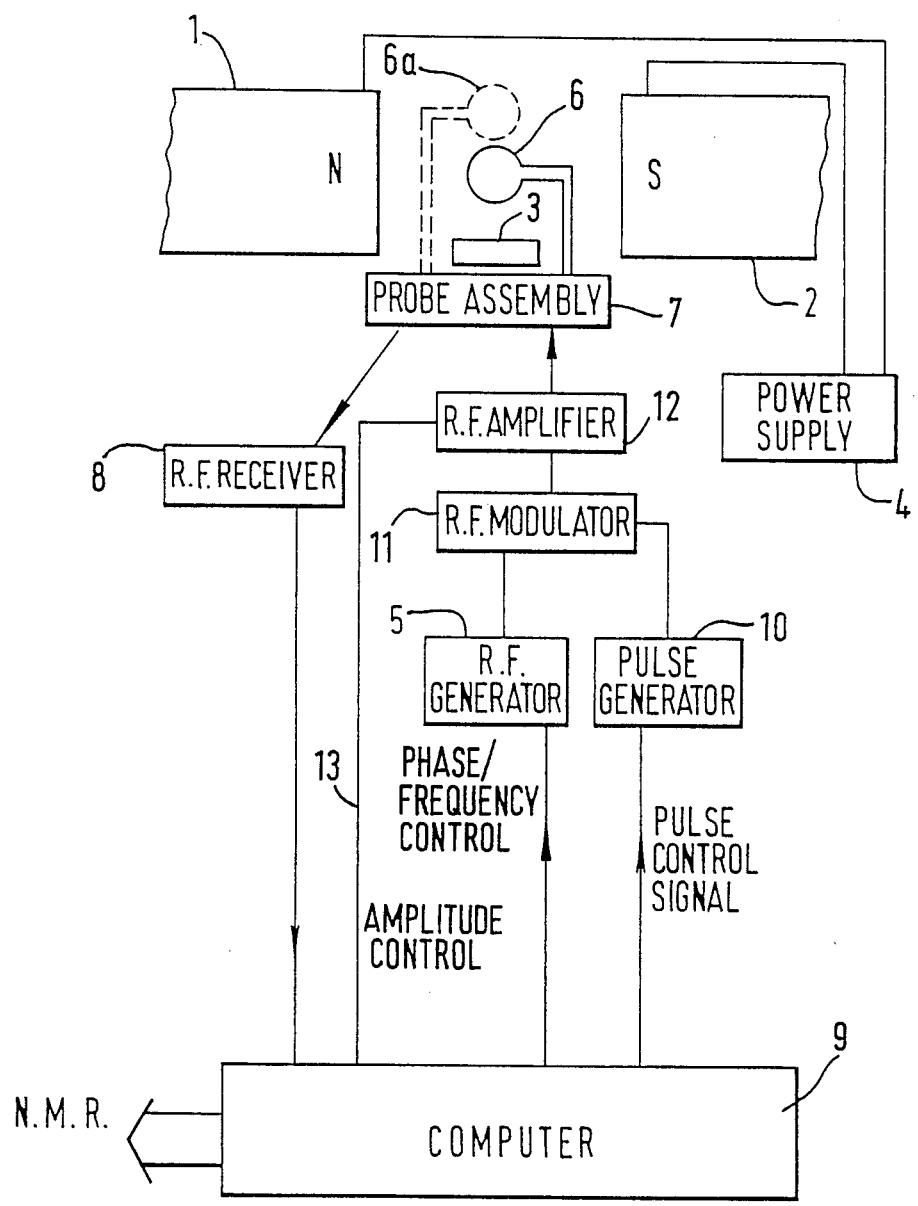
FIG. 7 is a schematic diagram of apparatus in accordance with the invention.

FIG. 6 shows theoretical contour plots as a function of $\theta$ and $\Delta H$ for (a) $I_y{}^f$ and (b) $I_x{}^f$ for a sequence similar to [R] but including the procedure used in scheme [O] to eliminate 450° signals as well as 270° signals. I.e.: {2.18×0.489$\theta$+1.75×1.082$\theta$+0.831$\theta$+0.796×1.561$\theta$-}; $2\theta[\pm x,\overline{O}]$; acquire. Off-resonance, the usefulness of the scheme is limited to about 0.04 $t_{90}{}^{-i}$ which is much reduced to that for (c) the scheme: {2.18×0.489$\theta$+1.75×1.082$\theta$+0.831$\theta$+0.796×1.561$\theta$} $2\theta[\pm x,\pm y]$; acquire$+2\theta[\pm x,\overline{O}]$; {2.18×0.489$\theta$+1.75×1.082$\theta$+0.831$\theta$+0.796×1.561$\theta$-}; acquire, which is similar to [T] but includes the [O] procedure for eliminating 450° signals. Ony $I_y{}^f$ is plotted in (c) because $I_x{}^f = 0$. FIG. 7 illustrates schematically apparatus for obtaining a localized nuclear magnetic resonance signal. The apparatus comprises a magnet assembly having north and south poles 1 and 2, and a sample support 3, positioned to support the sample, for example a human patient, between the pole pieces 1 and 2. The magnet assembly may be a permanent magnet assembly, but is preferably a superconducting electromagnet, powered by a power supply 4. Rf generator 5 is provided to supply an Rf signal to a sample on the sample support, by means of an Rf coil 6. The Rf coil 6 is mounted on a probe assembly 7 of conventional form.

An Rf receiver 8 is connected to a suitable receiving antenna, which may be the coil 6, or may be one or more other coils of conventional form, for example a coil 6a as illustrated schematically in FIG. 7. The Rf generator 5 and Rf receiver 8 are connected to a computer 9, programmed and arranged to control the phase and frequency of Rf signals produced by the Rf generator 5, and to receive signals from the Rf receiver 8 and process them as indicated herein, in order to obtain the desired N.M.R. signal.

A pulse generator 10 is also controlled by computer 9. The ouput from the pulse generator 10 is fed to an Rf modulator 11, which modulates the Rf signal produced by Rf generator 5, thereby to produce the desired sequence of Rf pulses. The sequence of Rf pulses is amplified by Rf amplifier 12, which not only controls the overall amplitude of Rf pulse signals fed to the probe assembly 7, but also, by means of control link 13, can control the relative amplitudes of individual Rf pulses, under the control of the computer 9.

The computer 9 is so programmed and arranged as to produce the desired pulse range, as disclosed herein, according to methods which are generally known per se.

Before dealing with the practical aspect of the present invention, it is useful to provide some background to the theory involved.

In the present work, where we study the evolution of the magnetization associated with a single species of nucleus, the polarization vector after a single sequence of pulses can be written in the rotating reference frame as the product $$\underline{I}^f = g \ldots e d \, \underline{I}^0 \tag{1}$$

where d, e . . . are rotation matrices corresponding to the first, second . . . pulse or free evolution period, and $\underline{I}^o$ is the initial polarization vector, which usually has just a z component. The signal is determined by the x and y components of $\underline{I}^f$. The result obtained from a linear combination of individual signals resulting from running the sequence with different values of the second pulse, for example, is just $$\sum_n a_n g \ldots e_n d \underline{I}^0 = g \ldots \left( \sum_n a_n e_n \right) d \underline{I}^0 \tag{2}$$

where the $e_n$ matrix corresponds to a particular value of the second pulse, and $a_n$ is the associated weighting factor in the linear combination. The factor in brackets is a linear combination of matrices which forms a single matrix f, which in general will no longer represent a rotation, and which we call a cycle matrix. Clearly this procedure can be applied to the cycling of more than one pulse, provided the summations are independent. That is, if e takes N different values and d takes M different values there will be N×M individual sequences and we can include the effect of both cyclings by using two separate cycle matrices in place of e and d.

Thus the effect of a cycled pulse acting on a vector polarization $\underline{I}$ can be calculated by finding the new vector $\underline{\bar{I}}$ it produces, whose components are given by $$\begin{pmatrix} \bar{I}_x \\ \bar{I}_y \\ \bar{I}_z \end{pmatrix} = \begin{pmatrix} f_{xx} f_{xy} f_{xz} \\ f_{yx} f_{yy} f_{yz} \\ f_{zx} f_{zy} f_{zz} \end{pmatrix} \begin{pmatrix} I_x \\ I_y \\ I_z \end{pmatrix} \tag{3}$$

that is $$\bar{I}_i = \sum_j f_{ij} I_j \tag{4}$$

where i and j take the values x, y, z. Finding the signal in this way from the x and y components of a single vector resulting from the successive cycle matrices is more efficient than summing individual signals from a large number of sequences.

In the combinations derived below, normalized weighting coefficients are used, with the normalization accomplished by dividing by the number of individual sequences involved. For example, for a subtraction of the results of two individual sequences, the weighting coefficients are $\frac{1}{2}$ and $-\frac{1}{2}$.

The matrices for rotations through angle $\theta$ about the x, y and z axes of the rotating reference frame respectively are $$f(\theta[x]) = \begin{pmatrix} 1 & 0 & 0 \\ 0 & \cos\theta & \sin\theta \\ 0 & -\sin\theta & \cos\theta \end{pmatrix} \quad [5]$$

$$f(\theta[y]) = \begin{pmatrix} \cos\theta & 0 & -\sin\theta \\ 0 & 1 & 0 \\ \sin\theta & 0 & \cos\theta \end{pmatrix} \quad [6]$$

$$f(\theta[z]) = \begin{pmatrix} \cos\theta & \sin\theta & 0 \\ -\sin\theta & \cos\theta & 0 \\ 0 & 0 & 1 \end{pmatrix} \quad [7]$$

The sign convention used is one of clockwise rotation about the relevant axis viewed looking along this axis towards the origin. The sign of off-diagonal $\sin\theta$ elements in these and all subsequent matrices is also dependent on the selection of rotating frame axes. The convention used here is that x is clockwise of y when looking along z towards the origin.

As an example of a cycle matrix, the transformation matrix for an on-resonance $2\theta[\pm x]$ type pulse is found by substituting $2\theta$ for $\theta$ in [5] and adding the result to itself with $\theta$ replaced by $-\theta$ and normalizing by dividing by two, giving $$f(2\theta[\pm x]) = \begin{pmatrix} 1 & 0 & 0 \\ 0 & \cos 2\theta & 0 \\ 0 & 0 & \cos 2\theta \end{pmatrix} \quad [8]$$

For conciseness, only the off-resonance matrices are given below, the on-resonance matrices being found by setting the off-resonance parameter $\alpha$ to zero. Off-resonance pulses are about the well-known tilted axis at angle $\alpha$ to the transverse plane, where $\tan\alpha$ is the ratio of the resonance offset ($\Delta H$) in Hz to the rf field strength expressed in Hz, i.e.

$$\tan\alpha = 4\Delta H t_{90} \quad [9]$$

where $t_{90}$ is the on-resonance 90° pulse time in seconds. Compared to a $\theta$ pulse on-resonance, there is an increased effective rf field off-resonance leading to a larger rotation about the tilted axis given by $$\theta' = \theta \sec\alpha \quad [10]$$

A rotation about such a tilted axis can always be represented by a succession of three rotations about non-tilted axes. For example an off-resonance pulse of x phase, that is, a rotation through $\theta'$ about an axis in the xz plane at angle $\alpha$ to the x axis is equivalent to a rotation through $-\alpha$ about y followed by a rotation through $\theta'$ about x and then a rotation through $+\alpha$ about y. Thus the matrix for this rotation is the product of the three corresponding matrices with the left and right obtained from [6] with $\alpha$ and $-\alpha$ in place of $\theta$, and the second obtained from [5] with $\theta'$ in place of $\theta$, giving $$f(\theta[x],\alpha) = \quad [11]$$

-continued $$\begin{pmatrix} \cos^2\alpha + \sin^2\alpha\cos\theta' & \sin\alpha\sin\theta' & \sin2\alpha\sin^2(\theta'/2) \\ -\sin\alpha\sin\theta' & \cos\theta' & \cos\alpha\sin\theta' \\ \sin2\alpha\sin^2(\theta'/2) & -\cos\alpha\sin\theta' & \sin^2\alpha + \cos^2\alpha\cos\theta' \end{pmatrix}$$

where the $\alpha$ in $f(\theta[x],\alpha)$ signifies the off-resonance case.

The matrix for the off-resonance two-pulse cycle $2\theta[\pm]$ is obtained by substituting $2\theta'$ for $\theta'$ in [11] and adding it to the corresponding expression obtained by changing $\theta'$ to $-\theta'$ and $\alpha$ to $-\alpha$. Both these changes are required because a $2\theta'$ pulse about an axis tilted an angle $\alpha$ from $-x$ towards z is equivalent to a $-2\theta'$ pulse about an axis tilted an angle $-\alpha$ from x towards z. This gives $$f(2\theta[\pm x],\alpha) = \quad [12]$$

$$\begin{pmatrix} \cos^2\alpha + \sin^2\alpha\cos 2\theta' & \sin\alpha\sin 2\theta' & 0 \\ -\sin\alpha\sin 2\theta' & \cos 2\theta' & 0 \\ 0 & 0 & \sin^2\alpha + \cos^2\alpha\cos 2\theta' \end{pmatrix}$$

and similarly $$f(2\theta[\pm y],\alpha) = \quad [13]$$

$$\begin{pmatrix} \cos 2\theta' & \sin\alpha\sin 2\theta' & 0 \\ -\sin\alpha\sin 2\theta' & \cos^2\alpha + \sin^2\alpha\cos 2\theta' & 0 \\ 0 & 0 & \sin^2\alpha + \cos^2\alpha\cos 2\theta' \end{pmatrix}$$

The matrix for the four-pulse cycle $2\theta[\pm x,\pm y]$ is obtained from $$2f(2\theta[\pm x,\pm y],\alpha) = f(2\theta[\pm x],\alpha) - f(2\theta[\pm y],\alpha), \quad [14]$$

where the minus sign corresponds to the usual inversion of receiver phase for this type of pulse (1), giving the simple diagonal matrix $$f(2\theta[\pm x, \pm y],\alpha) = \cos^2\alpha\sin^2\theta' \begin{pmatrix} 1 & 0 & 0 \\ 0 & -1 & 0 \\ 0 & 0 & 0 \end{pmatrix} \quad [15]$$

For n successive applications of this pulse $$f^n(2\theta[\pm x,\pm y],\alpha) = \cos^{2n}\alpha\sin^{2n}\theta' \begin{pmatrix} 1 & 0 & 0 \\ 0 & (-1)^n & 0 \\ 0 & 0 & 0 \end{pmatrix} \quad [16]$$

$2\theta[\pm x]$ type pulse before the $\theta$ pulse

Because $f_z = f_{yz} = 0$ in [12], a $2\theta[\pm x]$ type pulse simply reduces z magnetization by the factor $\sin^2\alpha + \cos^2\alpha\cos 2\theta'$ and no detectable x or y magnetization is generated even when the pulses are off-resonance. For ease of recognition we label this factor $f_\pm$ and express it in its alternative form. Thus $$\bar{I}_z = f_{zz} I_z = f_\pm I_z = (1 - 2\cos^2\alpha\sin^2\theta') I_z \quad [17]$$

The same result is obtained from [13], so it does not matter which pulse axis is used and any axis in the transverse plane will suffice.

When $\theta'=90°$ (corresponding to maximum signal intensity off-resonance for most depth pulse schemes), $f_{\pm}=\cos 2\alpha$. Since $0<\alpha<90°$, a $2\theta[\pm x]$ type pulse induces a null point when $\alpha=45°$, i.e. at $\Delta H=0.25\ t_{90}^{-1}$, and further off-resonance the pulse no longer inverts z magnetization. Clearly, this type of pulse does not appear to have any use as a chemical-shift selective pulse. However, even off-resonance, an inversion-recovery $T_1$ delay period can be inserted after a $2\theta[\pm x]$ pulse and accurate $T_1$ times can be calculated using a normal three parameter fit, provided the $2\theta[\pm x]$ pulse significantly reduces z magnetization.

Because no detectable transverse magnetization is generated by a $2\theta[\pm x]$ type pulse, the pulse may be repeated, or a succession of such pulses, with values differing from $2\theta$, may be used.

$\theta$ excitation pulse

In our schemes, pulses preceding $\theta$ are of the type $2\theta[\pm x]$ and these do not generate detectable transverse magnetization. Hence we are only concerned with generation of x and y magnetization from z magnetization, and for a $\theta[x]$ pulse this is given by $f_{xz}$ and $f_{yz}$ of [11], respectively; which we relabel $f_x$ and $f_y$ respectively:

$$\bar{I}_x = f_{xz} I_z = f_x I_z = \sin 2\alpha \sin^2(\theta'/2) I_z \quad [18]$$

$$\bar{I}_y = f_{yz} I_z = f_y I_z = \cos\alpha \sin\theta' I_z \quad [19]$$

$\bar{I}_y$ represents the normal absorption-mode signal which is of course maximum on-resonance and has an approximate sinx/x dependence with successive minima and maxima of $-34\%$, $20\%$, $-14\%$, ... for $\theta=90°$ at chemical shifts of $0.69\ t_{90}^{-1}$, $1.20\ t_{90}^{-1}$, $1.72\ t_{90}^{-1}$ ... Hz, respectively. This behaviour off-resonance is complicated by the dispersion-mode signal, represented by $\bar{I}_x$, which is zero on-resonance and reaches a maximum of 50% at $0.25\ t_{90}^{-1}$. The total detectable magnetization is given by $$\bar{I} = (\bar{I}_x^2 + \bar{I}_y^2)^{\frac{1}{2}} \quad [20]$$

with a phase shift across the spectrum given by $$\tan\beta = \bar{I}_x/\bar{I}_y \quad [21]$$

These well known properties of a single square pulse make it of little use as a chemical-shift selective pulse.

$2\theta[\pm x,\pm y]$ type pulse after the $\theta$ pulse

The matrix [15] for a $2\theta[\pm x,\pm y]$ type pulse is quite remarkable in its simplicity. When acting on $\bar{I}$ it reduces any $I_z$ to zero, and multiplies $I_x$ and $I_y$ by $\cos^2\alpha \sin^2\theta'$ and reverses the sign of $I_y$. I.e., using the label $f_{\pm\pm}$ $$\bar{I}_x = f_{\pm\pm} I_x = \cos^2\alpha \sin^2\theta'\ I_x \quad [22]$$

and $$\bar{I}_y = -f_{\pm\pm} I_y = -\cos^2\alpha \sin^2\theta'\ I_y \quad [23]$$

Thus no $\alpha$-dependent phase distortion results, and because any z magnetization becomes undetectable, the pulse has no use prior to $\theta$.

Comparing [15] with [5], with $\theta=180°$ in [5], the action of a $2\theta[\pm x,\pm y]$ pulse on the transverse components $I_x$ and $I_y$ is, apart from the magnitude reducing factor $f_{\pm\pm}$, identical with the action of a 180° pulse about the x-axis. Thus, $2\theta[\pm x,\pm y]$ acts as a refocusing pulse when used at the middle of a pulse sequence delay period. This refocusing property of a $2\theta[\pm x,\pm y]$ pulse was of course the starting point for depth pulse schemes as described in J. Mag. Res, 59, 406–609. However, here we have proven that this refocusing property is not only valid for any $\theta$ value, but also for any off-resonance shift. In addition, from matrix [16] it is clear that the refocusing property exists only if an odd number of $2\theta[\pm x,\pm y]$ pulses is applied at the center of a sequence delay period. For an even number of $2\theta[\pm x,\pm y]$ pulses, the phase of the transverse components are unaltered (like the action of a 360° pulse).

This result for even pulses is important because it means that the transverse axes used for the pulses are irrelevant, and permits the applications of say two $2\theta[\pm x,\pm y]$ pulses by a separate transmitter coil from that used to apply the $\theta$ pulse, without introducing phase errors from different parts of the sample as might result from a totally different Rf field distribution. This is an important component of the depth pulse method which uses multiple rf coils for sensitive volume localization.

Pulse phase alternation, signified by $\pm x$ and $\pm y$, can be achieved accurately by inversion, but it is more difficult instrumentally to generate a 90° phase change from $\pm x$ to $\pm y$. Thus it is pertinent to study the effect of non-orthogonality of the transverse pulse axes, in particular with the $\pm y$ axes being rotated through angle $\gamma$ from their proper positions to become $\pm \bar{y}$. A rotation through $\theta$ about the axis $\bar{y}$ is equivalent to three rotations, first through $\gamma$ about z, then through $\theta$ about y, then through $-\gamma$ about z. Thus $f(2\theta[\pm \bar{y}],\alpha)$ may be found by multiplying matrix [13] on the right by matrix [7] with $\gamma$ in place of $\theta$, and on the left by [7] with $-\gamma$ in place of $\theta$. Subtracting the result from $f(2\theta[\pm x],\alpha)$, i.e. matrix [12], and including a $\frac{1}{2}$ normalization factor gives $$f(2\theta[\pm x,\pm \bar{y}],\alpha) = \cos\gamma \cos^2\alpha \sin^2\theta' \begin{pmatrix} \cos\gamma & \sin\gamma & 0 \\ \sin\gamma & -\cos\gamma & 0 \\ 0 & 0 & 0 \end{pmatrix} \quad [24]$$

which should be compared to the ideal case described by equation [15]. The matrix elements in [24] correspond to a phase shift through angle $\gamma$ of the transverse magnetization, and in addition, the non-orthogonality of a $2\theta[\pm x,\pm y]$ pulse leads to a reduction of signal magnitude by $\cos\gamma$. These effects will be minor and importantly, the dependence on $\theta$ and $\alpha$, and also the property of destroying any $I_z$ component, are unaffected by the pulse phase error. Furthermore, when used in a spin-echo sequence, refocusing still occurs but along an axis at angle $\gamma$ to the normal axis.

The $\cos^2\alpha$ term in [22] and [23] makes a $2\theta[\pm x,\pm y]$ pulse selective with respect to chemical shift. For example, for $\alpha>72°$, i.e. $\Delta H>0.75\ t_{90}^{-1}$, any detectable transverse magnetization prior to the pulse is reduced by more than a factor of ten. Since it is normal to include a $2\theta[\pm x,\pm y]$ pulse in depth pulse schemes, all such depth pulses are also cleanly selective with respect to chemical shift. This is discussed in more detail in the following sections.

$2\theta[\pm x]$ type pulse after the $\theta$ pulse

From equation [8], a $2\theta[\pm x]$ type pulse reduces on-resonance y magnetization (after a $\theta$ pulse) by $\cos 2\theta$, exactly the same effect as on z magnetization prior to the $\theta$ pulse. However, because $f_{xy}$ and $f_{yx} \neq 0$ in [12] a $2\theta[\pm x]$ pulse mixes x and y magnetization off-resonance, and although the overall effect is quite complicated, there is a special use of the pulse after the excitation pulse. For future use we note the relevant expressions in terms of the easily recognizable labels $f_{\pm x}, f_{\pm y}$ and $f_{\pm xy}$:

$$\bar{I}_x = (\cos^2\alpha + \sin^2\alpha \cos 2\theta')I_x + \sin\alpha \sin 2\theta' \, I_y = \quad [25]$$

$$f_{\pm x} I_x + f_{\pm xy} I_y$$

and $$\bar{I}_y = -\sin\alpha \sin 2\theta' \, I_x + \cos 2\theta' \, I_y = -f_{\pm xy} I_x + f_{\pm y} I_y \quad [26]$$

DESIGN AND EXPERIMENTAL VERIFICATION OF DEPTH PULSE SCHEMES

As well as a detailed knowledge of off-resonance effects, the general cycle matrix theory has also uncovered some new properties of $2\theta[\pm x]$ type pulses: From [2] and [12] it is clear that multiple $2\theta[\pm x]$ type pulses can be readily used prior to the $\theta$ excitation pulse, and from [8] there is an indication that there may be a purpose for such pulses after the $\theta$ excitation pulse.

This general theory of course reduces to the expressions obtained originally using the pictorial vector model for the specific cases of on-resonance $2\theta[\pm x, \pm y]$ pulses after, and $2\theta[\pm x]$ before, the $\theta$ pulse. The relevant factors $f_{\pm\pm}$ and $f_{\pm}$ reduce to $\sin^2 \theta$ and $\cos 2\theta$ respectively. The $\cos 2\theta$ factor expected for a $2\theta[\pm x]$ pulse subsequent to $\theta$ was readily confirmed by experiment (see FIG. 1). These factors may be combined in various ways with the $\sin \theta$ on-resonance factor for the $\theta$ excitation pulse, as a first step in the design of depth pulse schemes. Having obtained a depth pulse scheme which satisfactorily limits detectable magnetization between suitable values of $\theta$, the second stage is to study the behaviour of the scheme off-resonance by combining the factors listed in equations [17] to [19], [22], [23], [25] and [26] and thus determine the chemical shift limits within which the depth pulse scheme is useful.

The original depth pulse schemes were concerned with limiting the pulse angle limits within which substantial signals could be observed for $\theta$ angles close to 90°. In addition, schemes have been devised which substantially eliminate the intense signals corresponding to $\theta$ values close to 270° and 450°, i.e. "high flux signals". The more general theory presented here now enables significant improvements and extensions to both types of schemes.

Reduction of pulse angle limits for 90° signals

There is an increasing reduction in the pulse angle limits for 90° signals for the following schemes, [A] to [E], of which all except [D] were part of the original invention:

| | |
|---|---|
| $\theta$; $2\theta[\pm x, \pm y]$; acquire signal | [A] |
| $\theta$; $(2\theta[\pm x, \pm y])_2$; acquire | [B] |
| $2\theta[\pm x]$; $\theta$; $2\theta[\pm x, \pm y]$; acquire | [C] |
| $(2\theta[\pm x])_2$; $\theta$; $2\theta[\pm, \pm y]$; acquire | [D] |
| $2\theta[\pm x]$; $\theta$; $(2\theta[\pm x, \pm y])_2$; acquire | [E] |

As an example of the combination of the above-mentioned on-resonance factors for the individual pulses, the dependence of signal intensity on $\theta$ for scheme [D] is given by $\cos^2 2\theta \sin^3 \theta$. For [A], on-resonance signals are suppressed to $\leq 4\%$ between $\theta=0°$ and 20° and between equivalent $\pm 20°$ limits around $\theta=180°$, 360° . . . ; for [B] signals $\leq 4\%$: 0°–32°, 148°–212°, . . . ; for [C] signals $\leq 7\%$: 0°–49°, 131°–299°, . . . ; for [D] signals $\leq 3\%$: 0°–52°, 128°–232°, . . . ; and for [E] signals $\leq 2\%$: 0°–48°, 132°–228°, . . . The new scheme [D], which utilizes two $2\theta[\pm x]$ pulses, gives similar signal suppression to the established scheme [E], yet achieves this in a total phase cycle of 16 transients as compared to 32 for [E].

The general behaviour of schemes [A] to [E] off-resonance is readily quantified by multiplying together the factors given in equations [17] to [19] and [22], [23] as indicated by equation [2]. For example, for scheme [D] the dependence of the final y magnetization $I_y^f$ on $\theta$ and $\alpha$ is given by $-f_{\pm}^2 f_y f_{\pm\pm} I_z°$ and $I_x^f$ is given by $f_{\pm}^2 f_x f_{\pm\pm} I_z°$. Two-dimensional contours of detectable magnetization versus $\theta$ and $\Delta H$ (i.e. $\tan \alpha/4$ $t_{90}$) have been calculated for each of the schemes and a typical result is given in FIG. 2 for scheme [E]. In all cases, the $2\theta[\pm x, \pm y]$ pulses impose a chemical-shift selectivity and reduce signal intensity close to zero far off-resonance without large oscillations between positive and negative signals. For schemes which include a $2\theta[\pm x]$ pulse, the chemical-shift selectivity is sharpened by the imposition of a null point at $\theta'=90°$ and $\Delta H=0.25$ $t_{90}^{-1}$. $\theta'=90°$ corresponds to a line of maximum signal intensity off-resonance which curves to the left by virtue of the action of equation [10]. (The curvature is increasingly more pronounced for the 270° and 450° signal regions). For [E] the null point is calculated to be at $\theta=64°$ and $\Delta H=0.25$ $t_{90}^{-1}$ using equation [10]. From FIG. 2(a) it can be seen that this null is just one point on a zero intensity contour which surrounds the 90° signal region and crosses the horizontal axis at $\theta=45°$ and 135°. Another typical feature of these detectable magnetization contour plots illustrated in FIG. 2 is that the regions of weaker dispersion signals $I_x^f$ (FIG. 2b) are overlapped by the regions of absorption signals $I_y^f$ (FIG. 2a). Thus the overall effect of the dispersion signals is fairly minor. The total detectable magnetization given by equation [20] is only about 10%, or less, different from $I_y^f$, and the phase roll across the spectrum given by equation [21] is modest and approximately linear and would be substantially removed by normal phase correction routines. For example, the phase shift for [E] is 21° at the chemical shift where $I_y^f$ has fallen to 50% of its value on-resonance.

Clearly, the loss of detectable magnetization off-resonance limits the usefulness of depth pulses, as a means of sample localization, to within certain off-resonance limits, say the chemical shift at which $I_y^f$ is 50% of maximum. Rather than conduct a two-dimensional calculation of the type illustrated in FIG. 2, the 50% limits can be easily calculated from the general expressions with $\theta'=90°$. E.g., for scheme [E] the expression for $I_y^f$ simplifies to $\cos 2\alpha \cos^5 \alpha$ which is 0.5 at $\Delta H=0.10$ $t_{90}^{-1}$, which, from FIG. 2a, is quite close to the equivalent value for $\theta=90°$, a more difficult calculation. The limit of 0.10 $t_{90}^{-1}$ compares to a 50% limit of 0.27 $t_{90}^{-1}$ for $I_y^f$ for a single square pulse at $\theta=90°$. Apart from these limits, there appears to be no other off-resonance effects which impair the usefulness of these depth pulses.

For schemes [C] to [E], substantial signals for $\theta$ angles close to 90° can only be obtained within the on-resonance limits of 45° and 135°. These limits arise because the cos $2\theta$ factors, introduced by the $2\theta[\pm x]$ pulses, have zeros at $\theta=45°$ and 135°. Noting the trigonometic identity $$-\cos 2\theta \sin \theta = \tfrac{1}{2}(\sin \theta - \sin 3\theta) \qquad [27]$$

it is clear that an equivalent scheme on-resonance to, for example, depth pulse [D] is $2\theta[\pm x]$; $\theta$; $2\theta[\pm x, \pm y]$; acquire$-2\theta[\pm x]$; $3\theta$; $2\theta[\pm x, \pm y]$; acquire, where the results of the second sequence is subtracted from the first, and which we will write in the shorthand form $$2\theta[\pm x]; \{\theta - 3\theta\}; 2\theta[\pm x, \pm y]; \text{acquire} \qquad [F]$$

For depth pulse [F] detectable magnetization on-resonance is given by $$I_y{}^f = (\tfrac{1}{2}) \cos 2\theta \, (\sin \theta - \sin 3\theta) \sin^2 \theta I_z{}^0, \qquad [28]$$

which is equivalent to that for scheme [D], $$I_y{}^f = \cos^2 2\theta \sin^3 \theta I_z{}^0 \qquad [29]$$

except for a trivial sign change (the $\tfrac{1}{2}$ fraction is a normalization constant). Similarly, scheme [E] is equivalent on-resonance to [G]:

$$\{\theta - 3\theta\}; (2\theta[\pm x, \pm y])_2; \text{acquire} \qquad [G]$$

Thus, the same 45° to 135° limits can be obtained by repeating a depth pulse with the excitation pulse tripled in length and subtracting the result, a procedure abbreviated as $\{\theta - 3\theta\}$. This technique can be extended by including more odd multiples of $\theta$, e.g. $\{\theta - 3\theta + 5\theta\}$. The multiples must be odd integers to give maxima or minima at $\theta = 90°$. For every extra odd multiple in the series, an extra zero is generated between 0° and 90°. These zeroes are

| | | | |
|---|---|---|---|
| for $\{\theta - 3\theta\}$: | | 45° | |
| $\{\theta - 3\theta + 5\theta\}$: | | 30° | 60° |
| $\{\theta - 3\theta + 5\theta - 7\theta\}$: | 22.5° | 45° | 67.5° |
| and for $\{\theta - 3\theta + 5\theta - 7\theta + 9\theta\}$: 18° | 36° | 54° | 72° |

More zeroes between 0° and 90° for the detectable magnetization can be generated using multiples of the $2\theta[\pm x]$ pulse. These zeroes are

| | | | |
|---|---|---|---|
| for $2\theta[\pm x]$: | | 45° | |
| $4\theta[\pm x]$: | 22.5° | 67.5° | |
| $6\theta[\pm x]$: | 15° | 45° | 75° |
| and for $8\theta[\pm x]$: 11.25° | 33.75° | 56.25° | 78.75° |

To reduce the limits of substantial signal intensity around $\theta = 90°$, the trick is to combine the $\{\theta - 3\theta\}$ type procedure with multiples of the $2\theta[\pm x]$ type pulse so that there is an even spread of zeroes between 0° and the new limit. These zeroes are of course repeated between 90° and 180°, 180° and 270°, and so on. Taking depth pulse [F] with limits of 90°±38° as the first in the series, where outside the limits detectable magnetization $\leq 3\%$ of maximum, these limits can be successively narrowed to 90°±28° using scheme [H], $$2\theta[\pm x]; \{\theta - 3\theta + 5\theta\}; 2\theta[\pm x, \pm y]; \text{acquire} \qquad [H]$$

to 90°±21° using scheme [I]

$$2\theta[\pm x]; 4\theta[\pm x]; \{\theta - 3\theta + 5\theta\}; 2\theta[\pm x, \pm y]; \text{acquire}, \qquad [I]$$

to 90°±17° using scheme [J]

$$2\theta[\pm x]; 4\theta[\pm x]; \{\theta - 3\theta + 5\theta - 7\theta + 9\theta\}; \\ 2\theta[\pm x, \pm y]; \text{acquire}, \qquad [J]$$

to 90°±10° using scheme [K]

$$4\theta[\pm x]; 6\theta[\pm x]; 8\theta[\pm x]; \{\theta - 3\theta + 5\theta - 7\theta + 9\theta\}; \\ 2\theta[\pm x, \pm y]; \text{acquire}. \qquad [K]$$

Note that in each case a $2\theta[\pm x, \pm y]$ pulse is included to eliminate signals close to 0°, 180°, 360°, ....

Experiments have confirmed the expected dependence for schemes [H] through [K] on-resonance and typical results are shown in FIG. 3.

A series of the kind $\theta - 3\theta + 5\theta$ is an example of a truncated Fourier series. Such series have more general application when non-unitary coefficients are used, when summing the transients resulting from the series of excitations pulses, (for example non-unitary coefficients are used in sequence [O] described below).

The factors given in equations [17] to [19] and [22], [23] are functions of $\theta'$. To obtain the factors for the multiple pulses of the $2\theta[\pm x]$ type, e.g. $6\theta[\pm x]$, or of the excitation pulse type, e.g. $3\theta$, it is merely necessary to substitute $\theta'$ in these equations by the multiple angle, in these examples $3\theta'$. Thus $I_y{}^f$ for scheme [J] is $$(1/5) f_{\pm}(\theta') f_{\pm}(2\theta')[f_y(\theta') - f_y(3\theta') + f_y(5\theta') - f_y(7\theta') \\ + f_y(9\theta')] f_{\pm \pm} I_z{}^0$$

and $I_x{}^f$ is the same expression with $f_x$ in place of $f_y$ (1/5 is a normalization constant). The off-resonance distribution of $I_y{}^f$ for schemes [F] to [K] is similar to that shown for [E] in FIG. 2 with the difference that the 90°, 270°, ... regions of signal distribution are progressively narrowed (see FIG. 4(a)). $I_x{}^f$ however is quite different because when $\theta' = n \times 90°$, n an integer, $\sin^2(\theta'/2) = \sin^2(3\theta'/2) = \sin^2(5\theta'/2) = \sin^2(7\theta'/2) = \sin^2(9\theta'/2)$ Thus for scheme [F], $f_x(\theta') - f_x(3\theta') = 0$ at $\theta' = 90°$, and so $I_x{}^f = 0$. Either side of $\theta' = 90°$ the dispersion-mode signals are negative and positive respectively and so across a sample sensitive volume, where $50° < \theta < 130°$, the dispersion signals would tend to mutually cancel. Because there is an odd number of multiple excitation pulses in schemes [H] to [K] substantial, but less efficient, cancellation of dispersion signals will generally occur for these, as indicated by FIG. 4(b) for scheme [J].

As for [A] to [E], apart from loss of detectable magnetization off-resonance, off-resonance effects do not cause major problems for [F] to [K]. The small curvature to lower $\theta$ values off-resonance, observed for the 90° region of [E] in FIG. 2a, becomes more significant relative to the narrower 90° regions for [H] to [K], but even for [K] this curvature is only marginally significant at $\Delta H = 0.11 \, t_{90}{}^{-1}$ where detectable magnetization has fallen to 50%. Again, the 50% limits off-resonance can be determined by setting $\theta' = 90°$ in the general expressions. Note that the various factors reduce to 1, cos $2\alpha$ and 1 for $4\theta[\pm x]$, $6\theta[\pm x]$ and $8\theta[\pm x]$ respectively, and to $\bar{I}_y = \cos\alpha I_z$ for $\{\theta-3\theta\}$, $\{\theta-3\theta+5\theta\}$ and $\{\theta-3\theta+5\theta-7\theta+9\theta\}$. Thus [G] has the same off-resonance limits as for [B], and [F] and [H] to [K] have the same limits as [C]. For the same reason, $I_y^f$ passes through a zero point at $\theta'=90°$ and $\Delta H=0.25 t_{90}^{-1}$ for all the schemes [F] and [H] to [K] (see FIG. 4(a) for [J]). Note that the low negative intensity region beyond this point does not extend back to the on-resonance axis as for sequence [C] and [E] (see FIG. 2(a)) because of the more complicated behaviour of [F], [H]–[K] as a function of $\theta$.

Elimination of high flux signals

On-resonance, a $\theta/3[\pm x]$ pulse prior to the excitation pulse $\theta$ will introduce a $\cos(\theta/3)$ factor which is zero at 270° and close to maximum at 90°. Thus addition of $\theta/3[\pm x]$ to scheme [F] for example will eliminate signals at $\theta=270°$, but because of the steepness of the cos $(\theta/3)$ curve as it passes through zero at 270°, +7% and −7% residual magnetization will be left at 252° and 288° respectively. However, these signals can be reduced to less than 1% by addition of a second $\theta/3[\pm x]$ pulse as in depth pulse [L]:

$(\theta/3[\pm x])_2$; $2\theta[\pm x]$; $\{\theta-3\theta\}$; $2\theta[\pm x,\pm y]$; acquire signal [L]

Two $\theta/3[\pm x]$ pulses lead to an additional factor of $\cos^2(\theta/3)$ on-resonance which is maximum at 0° and is 0.75 units at 90°. Thus the intensity of 90° signals are reduced by 25% and the point of maximum detectable magnetization is shifted slightly to 87.6°.

In place of $(\theta/3[\pm x])_2$, $(5\theta/3[\pm x])_2$ could be used thus introducing a $\cos^2(5\theta/3)$ factor on-resonance. Alternatively, a $4\theta/3[\pm x,\pm y]$ pulse could be used leading to a factor of $\sin^2(2\theta/3)$. Both these factors are zero at 270° and 0.75 at 90°. However, detailed calculations show that $(\theta/3[\pm x])_2$ is superior because $\cos^2(\theta/3)$ has a broader minimum at 270° than either $\cos^2(5\theta/3)$ or $\sin^2(2\theta/3)$.

This method can be extended to eliminate the 450° signals as well by using a $\theta/5[\pm x]$ pulse. One $\theta/3[\pm x]$ and one $\theta/5[\pm x]$ pulse as in scheme [M], $\theta/3[\pm x]$; $\theta/5[\pm x]$; $2\theta[\pm x]$; $\{\theta-3\theta\}$; $2\theta[\pm x,\pm y]$; acquire, [M]

is reasonable for reducing both 270° and 470° signals to ≦4% on-resonance, with only an 18% loss of signal at $\theta=90°$, but of course two pulses of each kind could be used, in which case there would be an additional loss of intensity at $\theta=90°$. $\theta/3[\pm x]$ and $\theta/5[\pm x]$ may of course be added to any of the above phase-cycled schemes.

From equation [17] the general factors for $\theta/3[\pm x]$ and $\theta/5[\pm x]$ are $f_\pm(\theta'/6)$ and $f_\pm(\theta'/10)$. Importantly, detailed calculations show that $(\theta/3[\pm x])_2$ and $(\theta/5[\pm x])_2$ eliminate signals for $\theta$ values close to 270° and 450° both on and off-resonance, and both x magnetization ($\bar{I}_x$) as well as y magnetization ($\bar{I}_y$). However, single $\theta/3[\pm x]$ and $\theta/5[\pm x]$ pulses are less efficient for $\bar{I}_y$ off-resonance, and when $\theta'=270°$ and 450°, sequence [M] generates negative signals of maximum intensity 7% and 6% respectively off-resonance at $0.13 t_{90}^{-1}$ and $0.10 t_{90}^{-1}$ respectively.

An entirely different method of eliminating high flux signals, described as part of the original invention, comes from modifications of the excitation pulse as in scheme [N], $2\theta[\pm x]\cdot\left\{2\times\dfrac{2\theta}{3}+\dfrac{4\theta}{3}\right\}$ ; $(2\theta[\pm x,\pm y])_2$; acquire [N]

which eliminates on-resonance 270° signals, and as in scheme [O]

$2\theta[\pm x]$;
$\{2.18\times 0.489\theta + 1.75\times 1.082\theta + 0.831\theta + 0.796\times 1.561\theta\}$; $(2\theta[\pm x,\pm y])_2$; acquire [O]

which eliminates on-resonance 450° signals. (The factors multiplying the variable excitation pulse, e.g. 2.18 in $2.18\times 0.489\theta$ are weighting factors used in the summation of transients or in the case of whole numbers, e.g. $2\times 2\theta/3$, a multiple of the basic number of transients can be obtained).

Unfortunately, this alternative method does not eliminate x magnetization off-resonance for $\theta$ values around 270° and 450° as $\bar{I}_x$ is still generated by the operation of equation [18]. For example, for $\{2\times 2\theta/3 + 4\theta/3\}$ $\bar{I}_x = (\tfrac{1}{3})[2 f_x(2\theta'/3) + f_x(4\theta'/3)]I_z = (\tfrac{2}{3})\sin 2\alpha\, I_z$ at $\theta' = 270°$, which when multiplied by $\cos 2\alpha$ for $2\theta[\pm x]$ and $\cos^4\alpha$ for $2\theta[\pm x,\pm y]$, as required for scheme [N], gives a maximum of 30% for $I_x^f$ at $\theta=257°$ and $\Delta H=0.08 t_{90}^{-1}$ ($\alpha=18°$). However, these unwanted dispersion signals can be eliminated using a short spinlock pulse of y phase, or more conveniently they can be substantially eliminated by omitting to apply one of the $2\theta[\pm x,\pm y]$ pulses for the $\pm y$ phases. I.e. depth pulse (N) becomes $2\theta[\pm x]\cdot\left\{2\times\dfrac{2\theta}{3}+\dfrac{4\theta}{3}\right\}$ ; $2\theta[\pm x,\pm y]$; $2\theta[\pm x]$; acquire [P]

$-2\times 2\theta[\pm x]\cdot\left\{2\times\dfrac{2\theta}{3}+\dfrac{4\theta}{3}\right\}$ ; $2\theta[\pm x,\pm y]$; acquire, where the factor 2 multiplying the second sequence simply multiplies the number of phase alternations in the sequence to signify that the same number of transients are acquired as for the first sequence in [P]. The result of applying a $2\theta[\pm x]$ pulse for half the transients, subsequent to the $\theta$ pulse, can be obtained from equations [25] and [26] or by subtracting the unit matrix from matrix [12] giving, after trigonometric rearrangement and normalization:

$$f(2\theta[\pm x, 0], \alpha) = \begin{pmatrix} -\sin^2\alpha\sin^2\theta' & \sin\alpha\sin 2\theta' & 0 \\ -\sin\alpha\sin 2\theta' & -\sin^2\theta' & 0 \\ 0 & 0 & -\cos^2\alpha\sin^2\theta' \end{pmatrix}$$ [30]

Thus the application of a $2\theta[\pm x]$ pulse in this way leads to $\bar{I}_x = \tfrac{1}{2}[(f_{\pm x}-1)I_x + f_{\pm xy}I_y] = -\sin^2\alpha\sin^2\theta'\, I_x + \sin\alpha\sin 2\theta'\, I_y,$ [31]

and $\bar{I}_y = \tfrac{1}{2}[-f_{\pm xy}I_x + (f_{\pm y}-1)I_y] = -\sin\alpha\sin 2\theta'\, I_x - \sin^2\theta'\, I_y,$ [32]

and overall for scheme [P], $$I_x{}^f = 1/6f_{\pm}([2f_x(2\theta'/3)+f_x(4\theta'/3)][f_{\pm x}-1]$$
$$-[2f_y(2\theta'/3)+f_y(4\theta'/3)]f_{\pm xy})f_{\pm\pm}I_z^\circ, \quad [33]$$

$$I_y{}^f = 1/6f_{\pm}([2f_y(2\theta'/3)+f_y(4\theta'/3)][1-f_{\pm y}]$$
$$-[2f_x(2\theta'/3)+f_x(4\theta'/3)]f_{\pm xy})f_{\pm\pm}I_z^\circ. \quad [34]$$

From [31], when $\theta'=270°$, $\bar{I}_x = -\sin^2 \alpha = -0.1$ at $\alpha=18°$. Thus the 30% maximum found for $I_x{}^f$ for sequence [N] is reduced to 3.5% for scheme [P], though these residual signals increase to 6% further off-resonance at $0.14 t_{90}{}^{-1}$. This comparison is illustrated in FIG. 5. When $\theta'=270°$, $I_y$ is unaffected by this procedure (see [32]), a convenient result.

The use of a $2\theta[\pm x]$ pulse in this way can be conveniently abbreviated to $2\theta[\pm x, \bar{0}]$ as in [30], where $\bar{0}$ means the repeated application of the sequence for the same number of transients without the $2\theta[\pm x]$ pulse but with inversion of receiver phase. Using this notation and writing a sequence analogous to [D] but including this method of eliminating 270° signals, gives $$(2\theta[\pm x])_2; \left\{ 2 \times \frac{2\theta}{3} + \frac{4\theta}{3} \right\} ; 2\theta[\pm x, \bar{0}]; \text{acquire} \quad [Q]$$

and similarly and analogous sequence to [A] is $$\left\{ 2 \times \frac{2\theta}{3} + \frac{4\theta}{3} \right\} ; 2\theta[\pm x, \bar{0}]; \text{acquire} \quad [R]$$

These schemes are worthy of consideration because they eliminate 270° signals with less restriction on 90° signals, and for example [R] can be achieved with a cycle of as little as 6 transients. The sequences can be constructed with only two localization pulses. Use of [R] with surface coils maintains S/N near maximum whilst eliminating the high flux signals near to the surface though to a more limited degree off-resonance (see FIGS. 6(a) and (b) for an example). Similar modifications to those illustrated in [P], [Q] and [R] may be applied to the more complicated procedure of eliminating both 270° and 450° signals used in [O] (an example is shown in FIGS. 6(a) and (b)). Note that although [P] does not have a great advantage over [L], $\theta/3[\pm x]$ and $\theta/5[\pm x]$ pulses are not good enough for equivalent sequences of the [R] type.

The $f_{zz}$ element in matrix [30] was not relevant to the generation of equations [31] to [34], but by observing that this element is $-f_{\pm\pm}$ there are further interesting possibilities. Thus if $2\theta[\pm x, \bar{0}]$ is used prior to the $\theta$ excitation pulse it will generate no observable transverse magnetization ($f_{xz}=f_{yz}=0$) but will invert the z magnetization (and thus the final detectable magnetization) and reduce it by $f_{\pm\pm}$. In comparison, a $2\theta[\pm x, \pm y]$ pulse after $\theta$ also reduces all detectable magnetization by $f_{\pm\pm}$ and inverts y magnetization but not x magnetization (see equations [22] and [23]). Thus the production of all dispersion signals can be eliminated from any of the above schemes by repeating the sequences with $2\theta[\pm x, \pm y]$ shifted in front of the excitation pulse and changed to $2\theta[\pm x, \bar{0}]$. For example, [E] would become $$2\theta[\pm x]; \theta; (2\theta[\pm x, \pm y])_2; \text{acquire} + 2\theta[\pm x];$$
$$2\theta[\pm x, \bar{0}]; \theta; 2\theta[\pm x, \pm y]; \text{acquire}, \quad [S]$$

and [R] would convert to $$\left\{ 2 \times \frac{2\theta}{3} + \frac{4\theta}{3} \right\} ; 2\theta[\pm x, \pm y]; \text{acquire} + \quad [T]$$

$$2\theta[\pm x, \bar{0}]; \left\{ 2 \times \frac{2\theta}{3} + \frac{4\theta}{3} \right\} ; \text{acquire}$$

and the *total* detectable magnetization for [S] for example is $I^f = I_y{}^f = f_\pm f_y f_{\pm\pm}{}^2$. This does double the number of transients in each complete cycle, and it depends for its success on the accuracy of pulse phases (because there is not equivalent to the $\gamma$ functions in [24] for $2\theta[\pm x, \bar{0}]$). However, all phase errors are removed from the 90° signal region and no dispersion signals can occur in place of the absorption-mode high flux signals when using the $\{2 \times 2\theta/3 + 4\theta/3\}$ type procedure. Furthermore, as dramatically illustrated in the comparison of FIG. 6(c) with 6(a) and (b), unlike schemes of the [Q] and [R] type, the selectivity is preserved off-resonance for schemes of the [S] and [T] type.

Phase-cycled chemical-shift selection pulses

Except for schemes [Q] and [R], all the above depth pulse schemes are cleanly selective with respect to chemical shift by virtue of the action of $2\theta[\pm x, \pm y]$ pulses. The dependence of intensity on chemical shift can be visualized from figures such as FIG. 2a. For example, for a homogeneous Rf coil, the influence of a linear field gradient is equivalent to changing the vertical $\Delta H$ axis to a distance axis, and the distribution of signal intensity along the gradient axis can be found by drawing a vertical line corresponding to $\theta=90°$, where $\Delta H=0$ corresponds to the mid-point of the gradient. For an inhomogeneous coil with a linear variation of Rf field strength, signal intensity variation with distance is given by a tilted axis passing through the gradient and Rf mid-point, i.e. $\theta=90°$ and $\Delta H=0$, and for non-linear variation of Rf, e.g. a surface coil, the variation is given by curved lines passing through the same mid-point.

Clearly, given the known variety of depth pulse schemes and the existence of inhomogeneous Rf coils of various types (not just surface coils), it is possible to formulate very sophisticated schemes to obtain suitably shaped sensitive volumes using both Rf inhomogeneity and chemical-shift selectivity in a linear field gradient. This general method may well find valuable applications in the future.

Experimental verification of off-resonance effects

Most of the above schemes have been tested on-resonance and some typical results are shown in FIG. 3.

During the development of the present invention is has become clear that off-resonance effects are of vital importance. First, the need to use large Rf coils in in vivo spectroscopy, the normal limitation on available Rf power, and the need to limit Rf heating in the live sample, all tend to reduce the Rf field strength that can be used. Thus it is necessary to know the off-resonance limits within which depth pulse schemes are useful. Second, as demonstrated for sequence [N] in FIG. 5(a), large residual dispersion signals can remain relatively closely to resonance when high flux signals are eliminated on-resonance. Third, most depth pulse schemes can be used as chemical-shift selective pulses and for this purpose an accurate knowledge of off-resonance behaviour is necessary. In consequence, experimental verification of the equations governing this off-resonance behavior is appropriate.

Given exact theoretical equations, the off-resonance behaviour of a selection of the above schemes was carefully examined by $^1$H NMR using a Bruker/ORS spectrometer and a 30 cm bore, 1.9T magnet. A 10 mm diameter, 2 mm thick aqueous phantom doped with a paramagnetic complex to reduce the $T_1$ to about 1.0 s was used. The phantom was coplanar with, and at the center of, a 70 mm diameter surface coil to guarantee a uniform pulse angle across the sample. $\theta$ was varied by incrementing each pulse length in steps of 18° up to 468° or 630°. $t_{90}$ ranged from 100 to 106 μsec. A matrix of results was obtained at shifts of 0, 500, 1000 and 1500 Hz off-resonance. 64, 96 or 128 transients were obtained for each measurement at a recycle time of 2.0 s. The phase angle of each recorded signal was measured after Fourier transformation using the spectrometer's automated zero order phase correction procedure. $t_{90}$ was accurately determined by obtaining the best fit with theory for the intensity of the largest on-resonance signals in the first high flux region (270°, 450° or 630°). Actual zero and first order phase corrections for the recorded phases were estimated by fitting a few of the most intense signals to the values expected, thus permitting an estimate of relative phase $\beta$ for each measurement. $I_x{}^f$ and $I_y{}^f$ were calculated from $\beta$ and $I^f$, the recorded signal intensity, using equations equivalent to [20] and [21]. The mean differences between theory and experiment are listed in Table 1 for $I_x{}^f$ and $I_y{}^f$ for several different depth pulse schemes. For large $I_y{}^f$, a small error in $\beta$ leads to a large error in $I_x{}^f$, and $I_x{}^f$ results have been excluded from the mean wherever $I_y{}^f > 25\%$ of maximum. In general the mean differences were around 0.5% or better with a standard deviation of about 2% or better: excellent agreement overall. Because the test of each scheme required several hours of experiments, the agreement between theory and experiment guarantees the accuracy of the theory and the stability and quality of pulses.

TABLE I

Comparison between theory and experiment for various depth pulse schemes for incremented values of $\theta$ and $\Delta H$.

| Scheme | Mean difference (%) ± standard deviation (no. of results) | |
|---|---|---|
| | $I_x{}^f$ | $I_y{}^f$ |
| [L] | 0.1 ± 1.2 (81) | 0.1 ± 2.1 (100) |
| $(\theta/3[\pm x])_2;[D]$ | 0.3 ± 1.0 (91) | 0.6 ± 1.7 (104) |
| [M] | 0.4 ± 1.6 (130) | 0.3 ± 1.6 (140) |
| [P] | 0.3 ± 1.4 (93) | 0.2 ± 1.8 (109) |
| modified [O][a] | 0.3 ± 0.9 (124) | 0.3 ± 1.7 (139) |

[a]$2\theta[\pm x];\{2.18 \times 0.489\theta + 1.75 \times 1.082\theta + 0.831\theta + 0.796 \times 1.56\theta\}$; $2\theta[\pm x,\pm y];2\theta[\pm x,\bar{0}]$; acquire.

Composite, Shaped or other Complex Pulses

The above analysis beginning with matrices [5] to [7] has primarily been concerned with simple square Rf pulses i.e. pulses which have uniform power and constant phase throughout their duration. As described below, this analysis can be readily extended to complex pulses.

Such complex pulses might be "composite" pulses which are a consecutive series of pulses of different phases (for example see M. H. Levitt and R. Freeman, Journal of Magnetic Resonance, 33, 473 (1979)). Another common variation used in in vivo N.M.R. imaging is "shaped" pulses (or selective pulses) whose amplitudes are varied (or shaped) during the pulse (for example see D. I. Hoult, Journal of Magnetic Resonance, 35, 69 (1979) and P. R. Locher, Philosophical Transactions of the Royal Society, London, Series B, 289, 537 (1980)). A further variation of shaped pulses is to modulate the phase of the pulse as well as the amplitude during the pulse (for example see M. S. Silver, R. I. Joseph and D. I. Hoult, Journal of Magnetic Resonance, 60, 320 (1984)). Another possibility is a pulse whose frequency is swept during the pulse. Since frequency is equal to the differential of phase with respect to time, this frequency modulation can be converted to phase modulation. Thus we will consider a "complex" pulse to be any Rf pulse whose amplitude, phase or frequency is varied (or modulated) during the pulse.

The action of any composite pulse can be determined by sequentially multiplying the rotation matrices (of the matrix [11] type) for each individual pulse within the composite pulse. Experimentally, it is usual to apply a shaped pulse by dividing it into a large number of smaller square pulses whose phase or amplitude is incremented, so the action of such an incremented shaped pulse can also be determined by multiplying together a series of rotation matrices of the matrix [11] type. Even when a complex pulse is experimentally applied with a continuous variation of amplitude, phase or frequency, its action can be determined theoretically by arbitrarily dividing it into a large number of incremented square pulses and taking the product of the relevant rotation matrices. The theoretical result can be obtained to any required accuracy by using smaller and smaller increments.

Consequently, any complex pulse can be expressed as the product of a series of rotation matrices. But the multiplication of a series of rotation matrices yields a single rotation matrix. Thus the action of any complex pulse at a particular resonance offset can be expressed in terms of rotation through some angle $\theta$ about an axis which is rotated through some (phase) angle $\beta$ from the x axis and which is tilted upward by some angle $\alpha$ from the xy plane of the rotating reference frame. For our purpose it is unnecessary to know how $\theta$, $\beta$ and $\alpha$ relate to any complex pulse in question. It is sufficient to use these as general quantities and the rotation matrix is $$f(\theta[\beta], \alpha) = \begin{bmatrix} \sin^2\beta \cos\theta + \cos^2\beta \times (\cos^2\alpha + \sin^2\alpha \cos\theta) & \sin\alpha \sin\theta - \sin 2\beta \times \cos^2\alpha \sin^2(\theta/2) & \sin\beta \cos\alpha \sin\theta + \cos\beta \sin 2\alpha \sin^2(\theta/2) \\ -\sin\alpha \sin\theta - \sin 2\beta \times \cos^2\alpha \sin^2(\theta/2) & \cos^2\beta \cos\theta + \sin^2\beta \times (\cos^2\alpha + \sin^2\alpha \cos\theta) & \cos\beta \cos\alpha \sin\theta - \sin\beta \sin 2\alpha \sin^2(\theta/2) \\ -\sin\beta \cos\alpha \sin\theta + \cos\beta \sin 2\alpha \sin^2(\theta/2) & -\cos\beta \cos\alpha \sin\theta - \sin\beta \sin 2\alpha \sin^2(\theta/2) & \sin^2\alpha + \cos^2\alpha \cos\theta \end{bmatrix} \quad [31]$$

Matrix [31] is derivable by multiplication of the three matrices $f(\beta[z]) \times f(\theta[x],\alpha) \times f(-\beta[z])$ as in matrices [7] and [11].

The operation of a phase-cycled complex pulse can be described by a single cycle matrix by taking linear combination of matrices of the matrix [31] type. Thus the cycle matrix for an arbitrary phase-alternated complex pulse is given by substituting $\beta+180°$ for $\beta$ in [31], adding the result to [31], and dividing by 2, giving $$f(\theta[\beta \pm x], \alpha) = \begin{bmatrix} \sin^2\beta \cos\theta + \cos^2\beta \times (\cos^2\alpha + \sin^2\alpha \cos\theta) & \sin\alpha \sin\theta - \sin 2\beta \times \cos^2\alpha \sin^2(\theta/2) & 0 \\ -\sin\alpha \sin\theta - \sin 2\beta \times \cos^2\alpha \sin^2(\theta/2) & \cos^2\beta \cos\theta + \sin^2\beta \times (\cos^2\alpha + \sin^2\alpha \cos\theta) & 0 \\ 0 & 0 & \sin^2\alpha + \cos^2\alpha \cos\theta \end{bmatrix} \quad [32]$$

Substituting $\beta+90°$ and $\beta+270°$ and summing the results gives $f(\theta[\beta\pm y],\alpha)$. The result for the full four-phase cycle is obtained by subtracting (to allow for receiver inversion) $f(\theta[\beta\pm y],\alpha)$ from [32] which yields $$f(\theta[\beta \pm x, \beta \pm y], \alpha) = \cos^2\alpha \sin^2(\theta/2) \begin{bmatrix} \cos 2\beta & -\sin 2\beta & 0 \\ -\sin 2\beta & -\cos 2\beta & 0 \\ 0 & 0 & 0 \end{bmatrix} \quad [33]$$

The $\cos 2\beta$ and $\sin 2\beta$ terms in [33] correspond to a trivial shift of the transverse magnetization whose magnitude is reduced by the factor $\cos^2\alpha \sin^2(\eta/2)$. Subtracting the unit matrix from matrix [33] and normalizing, gives $$f(\theta[\beta \pm x,\bar{0}], \alpha) = \begin{bmatrix} f_{xx} & f_{xy} & 0 \\ f_{yx} & f_{yy} & 0 \\ 0 & 0 & -\cos^2\alpha \sin^2(\theta/2) \end{bmatrix} \quad [34]$$

The $f_{xx}$, $f_{xy}$, $f_{yx}$, and $f_{yy}$ terms in [34] are unimportant for our purposes.

Matrices [32], [33] and [34] for complex pulses correspond to matrices [12], [14] and [30] for simple pulses. Comparison of the corresponding matrices shows that the important properties are preserved for phase-cycled complex pulses.

Complex pulses are used in N.M.R. for a variety of purposes, for example in spectral editing and N.M.R. imaging. When complex pulses are used with an Rf coil having a non-homogeneous excitation field, spurious transverse signals are generated whenever the complex pulse angle differs from the ideal value. The use of phase cycling of complex pulses enables these unwanted tranverse signal components to be minimized or eliminated.

For example, matrix [32] shows that phase alternation of a complex pulse does not permit conversion of z magnetization to transverse magnetization, and so a variable delay can be inserted after a phase-alternated complex pulse to enable inversion-recovery $T_1$ measurements.

From matrix [33] it is clear that a complex pulse can be used as a refocusing pulse in a spin-echo sequence provided the full four-phase cycle is used in which case all unrefocused tranverse components are eliminated.

Complex pulses are also of use for example in N.M.R. imaging experiments. Denoting a complex pulse by $\theta$, matrix [34] for $2\theta[\pm,\bar{0}]$ pulse again implies that no transverse magnetization can be generated from z magnetization using a phase-cycled complex pulse of this type. It is clear from matrix [34] that z magnetization is retained on resonance if the complex pulse induces an overall rotation through 180°. If the pulse was a shaped pulse such that it was selective when applied in a pulsed linear field gradient (as used in N.M.R. imaging), then outside the selected region, where $\theta$ in matrix [34] is zero, no magnetization can be detected from any initial z magnetization. This is an important result for localization in in vivo N.M.R. spectroscopy using pulsed field gradients and inhomogeneous Rf coils such as surface coils.

Other Uses of $2\theta[\pm x,\bar{0}]$ Type Pulses

As illustrated by schemes [S] and [T], a $2\theta[\pm x,\bar{0}]$ may be used in place of a $2\theta[\pm x,\pm y]$ pulse, and the two methods combined, to eliminate off-resonance dispersion signals resulting from any pulse sequence, including, for example, the dispersion signals resulting from a Fourier series of excitation pulses.

Existing methods which include $2\theta[\pm x,\pm y]$ type pulses may sometimes be simplified and improved by replacing such a pulse after the excitation pulse by a $2\theta[\pm x,\bar{0}]$ type pulse before the excitation pulse. An important example is the proven method of localization using multiple transmitter coils (M. R. Bendall, J. M. McKendry, I. D. Cresshull and R. J. Ordidge, Journal of Magnetic Resonance, 60, 473 (1984)). This method used two $2\phi[\pm x',\pm y']$ pulses from a second transmitter coil interspersed between $\tau$ spin-echo delays, subsequent to pulses from a first coil, as $$-\tau-2\phi[\pm x',\pm y']-2\tau-2\phi[\pm x',\pm y']-\tau-$$

These can be replaced by $(2\phi[\pm x',\bar{0}]_2-\tau-$ applied by the second coil prior to the pulses from the first coil.

As can be seen from the foregoing theoretical treatment, the exact behaviour of signal intensity, both on and off-resonance, of most of the described schemes (except [P], [Q] and [R]) depends only on the four simple multiplicative factors $f_\pm$, $f_x$, $f_y$ and $f_{\pm\pm}$. The final result can be written down by including one such factor for each pulse in the overall scheme.

The theory therefore supports our recent finding that the volume space into which N.M.R. signals can be localized can be decreased, with consequent increase in spatial differentiation, by the application of two or more pulses of the form $A[\pm x]$; $A[\pm x]$. Sequences of this form in which $A=\theta/3$ or $\theta/5$ are particularly useful, for example for the elimination of high-flux signals. Values of A which are multiples of 2, for example $4\theta$ or $6\theta$, are useful for the reduction of signals from the 90° signal region.

Particularly preferred are pulse sequences of the form $2\theta[\pm x]$; $2\theta[\pm x]$; $\theta$; $2\theta[\pm x,\pm y]$; acquire signal,
$2\theta[\pm x]$; $4\theta[\pm x]$; $\{\theta-3\theta+5\theta\}$; $2\theta[\pm x,\pm y]$; acquire signal, 2θ[±x]; 4θ[±x]; {θ−3θ+5θ−7θ+9θ};
   2θ[±x,±y]; acquire signal, or
4θ[±x]; 6θ[±x]; 8θ[±x]; {θ−3θ+5θ−7θ+9θ};
   2θ[±x,±y]; acquire signal.

Also particularly preferred are sequences including the pulse of the form 2θ[±x,$\overline{0}$]. In this procedure, the plurality of pulse sequences in which the 2θ[±x] is omitted may include only half the number of sequences as the one in which it is present, and appropriate weighting may be given to the signal acquisitions.

One application of the 2θ[±x,$\overline{0}$] pulse is to correct the off-resonance behaviour of localization schemes which depend on Rf inhomogeneity. Pulses of this kind have other important localization applications, when used in conjunction with pulsed field gradients, or when applied with an Rf coil separate from that used to apply the excitation pulse.

The truncated Fourier-type series of excitation pulses described above, of the form θ−3θ+5θ− . . . is of particular value in the pulse sequences described herein but have a far more general applicability, and may be used in other types of nuclear magnetic resonance experiment, in order to improve localization. The various aspects of the invention may be used alone, or, preferably, may be combined with each other, as specifically described herein.

Furthermore, the various phase-cycling procedures may be readily utilized with Rf pulses of composite or shaped form, or any other form of complex Rf pulse.

A quadrature phase compensation scheme may be employed in any of the schemes in accordance with the invention.

The methods in accordance with the invention may be carried out on any suitably equipped and programmed apparatus, and in accordance with a further aspect of the invention, there is provided apparatus for obtaining a N.M.R. spectrum from a sample comprising means for generating a static magnetic field, a support for supporting the sample in the static magnetic field, means for generating a plurality of radiofrequency pulses as specified above, a radiofrequency irradiation coil adjacent to the sample support, having an inhomogeneous radiofrequency field in the intended region of the sample, means for applying the plurality of pulse sequences to the coil, and means for detecting an N.M.R. signal from a sample supported by the sample support.

The apparatus according to the invention can be utilized for, for example, sensitive volume localization using multiple rf coils and/or pulsed or static field gradients, inversion-recovery T₁ measurements and spin-echo techniques. In addition, quadrature phase compensation may be added to the phase cycling used for the depth pulses, and in substitution for receiver phase inversion all the phases for a depth pulse transient may be inverted.

While the invention has been particularly shown and described with reference to a preferred embodiment thereof, it will be understood by those skilled in the art that the foregoing and other changes in form and details may be made therein without departing from the spirit and scope of the invention.

In the claims, terms are used which are defined in the foregoing specification or in the prior art references referred to above.

We claim:

1. A method of obtaining a localized nuclear magnetic resonance signal from a sample using a radiofrequency irradiation coil which provides an inhomogeneous radiofrequency field, comprising the steps of:

applying to the sample a plurality of radiofrequency pulse sequences, each pulse sequence including at least one excitation pulse, and at least three localization pulses,; wherein each localization pulse is of the form A[±x], or A[±x,±y], wherein "A" indicates the magnitude of the pulse, the notation [±x] indicates that the corresponding pulse occurs in one half of the corresponding pulse sequences with an initial phase and in the remaining pulse sequences with its phase shifted by 180° with respect to the initial phase, and wherein the notation [±x,±y] indicates that the corresponding pulse occurs with an initial phase in a first quarter of the pulse sequences, with a phase shifted by 90° from its initial phase in a second quarter of the pulse sequences, with a phase shifted by 180° from its initial phase in a third quarter of the pulse sequences and with a phase shifted by 270° from its initial phase in a fourth quarter of the pulse sequences, the arrangement being such that a pulse sequence exists with each permutation of permitted phase possibilities for each of the said localization pulses with each permitted phase possibility for each of the other said localization pulses, characterized in that the said pulse sequences contain at least two of the said localization pulses of the form A[±x];

acquiring an N.M.R. signal after each pulse sequence; and combining with N.M.R. signals obtained to produce a localized N.M.R. signal from selected regions of the sample.

2. A method as claimed in claim 1 wherein at least one of the said localization pulses has a magnitude selected from the group consisting of θ/5. θ/3, 2θ, 4θ, 6θ and 8θ, wherein θ is the magnitude of the excitation pulse.

3. A method as claimed in claim 1, wherein at least a second plurality of pulse sequences is applied to the sample, the n th plurality differing from the first plurality in that the magnitude of the excitation pulse in the n th plurality is (2n−1) times that of the first plurality, and thereby an n th localized N.M.R. signal is produced for each of the said pluralities, and the n N.M.R. signals are combined to produce an overall localized N.M.R. signal.

4. A method as claimed in claim 1 wherein the plurality of radiofrequency pulse sequences is of the form 2θ[±x; 2θ[±x]; θ; 2θ[±x,±y]; acquire signal,
  2θ]x]; 4θ[±x]; {θ−3θ+5θ}; 2θ±x,±y]; acquire signal,
  2θ[±x]; 4θ[±x]; {θ−3θ+5θ−7θ+9θ}; 2θ[±x,±y]; acquire signal, or
  4θ[±x]; 6θ[±x]; 8θ[±x]; {θ−3θ+5θ−7θ+9θ}; 2θ[±x,±y]; acquire signal wherein θ is an arbitrary pulse angle value.

5. A method as claimed in claim 1, wherein the sequences of radiofrequency pulses are of the form 2θ[±x]; 2θ[±x]; θ; 2θ[±x,±y]; acquire signal,
  2θ[±x]; 4θ[±x]; {θ−3θ+5θ}; 2θ[±x,±y]; acquire signal,
  2θ[±x]; 4θ[±x]; {θ−3θ+5θ−7θ+9θ}; 2θ[±x,±y]; acquire signal, or $4\theta[\pm x]$; $6\theta[\pm x]$; $8\theta[\pm x]$; $\{\theta-3\theta+5\theta-7\theta+9\theta\}$; $2\theta[\pm x,\pm y]$; acquire signal with the addition of at least one further pulse of the form $\theta/3[\pm x]$ or $\theta/5[\pm x]$, wherein $\theta$ is an arbitrary pulse angle value.

6. A method of obtaining a localized nuclear magnetic resonance signal from a sample using a radiofrequency irradiation coil which provides an inhomogeneous radiofrequency field, which method comprises:

applying to the sample a first plurality of radiofrequency pulse sequences, each of said first plurality of pulse sequences including an excitation pulse and at least two localization pulses, wherein each localization pulse is of the form $A[\pm x]$, or $A[\pm x,\pm y]$, or wherein "A" indicates the magnitude of the pulse, the notation $[\pm x]$ indicates that the corresponding pulse occurs in one half of the corresponding pulse sequences with an initial phase and in the remaining pulse sequences with its phase shifted by 180° with respect to the initial phase, and wherein the notation $[\pm x,\pm y]$ indicates that the corresponding pulse occurs within an initial phase in a first quarter of the pulse sequences, with a phase shifted by 90° from its initial phase in a second quarter of the pulse sequences, with a phase shifted by 180° from its initial phase in a third quarter of the pulse sequences and with a phase shifted by 270° from its initial phase in a fourth quarter of the pulse sequences, the arrangement being such that a pulse sequence exists with each permutation of permitted phase possibilities for each of said localization pulses with each permitted phase possibility for each of the other said localization pulses;

applying to the sample a second plurality sequences, the second differing from the first plurality by the omission in the sequence of the second plurality of at least one of said localization pulses;

acquiring an N.M.R. signal after each pulse sequence; and combining the N.M.R. signals obtained within each of said first and second pluralities of sequences, and further combining N.M.R. signals obtained from said first and second pluralities of sequences to produce a localized N.M.R. signal from selected regions of the sample.

7. A method as claimed in claim 6, wherein a third plurality of pulse sequences is applied to the sample, and wherein the said localization pulse which is omitted in the second plurality of pulse sequences is replaced in said third plurality of pulses by a localization pulse of the form $A[\pm x,\pm y]$.

8. A method as claimed in claim 7, wherein the localization pulse which is omitted during the second plurality of sequences precedes the excitation pulse in all pulse sequences, and wherein the replacement localization pulse in the third plurality of sequences follows the excitation pulse.

9. A method as claimed in claim 8, wherein each of the said pluralities is repeated to provide a plurality of runs, the nth run differing from the first run in that the magnitude of the excitation pulse in the nth run is $(2n-1)$ times the magnitude of the excitation pulse in the first run, and thereby an nth localized N.M.R. signal is produced for each of the said runs, and the n N.M.R. signals are combined to produce an overall localized N.M.R. signal.

10. A method of obtaining a localized nuclear magnetic resonance signal from a sample using a radiofrequency irradiation coil which provides an inhomogeneous radiofrequency field, comprising:

applying to the sample of a plurality radiofrequency pulse sequences, each pulse sequence including at least one localization pulse, and a plurality of excitation pulses, the nth excitation pulse having a magnitude of $(2n-1)$ times that of the first excitation pulse;

acquiring an N.M.R. signal after each pulse sequence; and combining the N.M.R. signals obtained to produce a localized N.M.R. signal from selected regions of the sample.

11. A method of obtaining a localized nuclear magnetic resonance signal from a sample using a radiofrequency irradiation coil which provides an inhomogeneous radiofrequency field, comprising:

applying to the sample n pluralities of radiofrequency pulse sequences, each pulse sequence including an excitation pulse and at least one localization pulse, the phase of said localization pulse being shifted by 180° in predetermined sequences of the said plurality;

wherein the magnitude of the excitation pulse in each sequence of the nth said plurality is $(2n-1)$ times the magnitude of the excitation pulse of a first plurality;

acquiring an N.M.R. signal after each pulse sequence; and combining the N.M.R. signals obtained to produce a localized N.M.R. signal from selected regions of the sample.

12. A method as claimed in claim 1 or claim 6, wherein a quadrature phase compensation scheme is employed.

13. A method as claimed in claim 1, wherein the same receiver phase is used for all signal acquisitions.

14. A method as claimed in claim 1 or claim 6, wherein a spin-echo technique or inversion-recovery $T_1$ measurement is carried out on the sample.

15. A method as claimed in claim 1 or claim 6, wherein at least one delay is provided between two or more of the said pulses.

16. A method as claimed in claim 15, wherein a pulsed magnetic field gradient is applied to the sample during a said delay period.

17. A method as claimed in claim 1 or claim 6, wherein at least one magnetic field gradient is applied to the sample during the application of a radiofrequency pulse.

18. A method as claimed in claim 1 or claim 6, wherein radiofrequency pulses are applied with a first radiofrequency coil and signal acquisition is carried out using a second radiofrequency coil.

19. A method as claimed in claim 1 or claim 6, wherein at least of the pulses is applied with a first radiofrequency coil and at least one of the other pulses is applied with one or more other radiofrequency coils.

20. A method as claimed in claim 1, 6 or 10 wherein one or more of the radiofrequency pulses is a complex radiofrequency pulse.

21. A method as claimed in claim 20, wherein the complex pulse is a composite or shaped pulse.

22. Apparatus for obtaining an N.M.R. spectrum from a sample, comprising means for generating a static magnetic field;

support means for supporting the sample in the static magnetic field;

means capable of generating a plurality of radiofrequency pulse sequences in one of the following manners: (A) each pulse sequence includes at least one excitation pulse, and at least three localization pulses, wherein each localization pulse is of the form A[±x], or A[±x,±y], wherein "A" indicates the magnitude of the pulse, the notation [±x] indicates that the corresponding pulse occurs in one half of the corresponding pulse sequences with an initial phase and in the remaining pulse sequences with its phase shifted by 90° with respect to the initial phase, and wherein the notation [±x,±y] indicates that the corresponding pulse occurs within an initial phase in a first quarter of the pulse sequences, with a phase shifted by 90° from its initial phase in a second quarter of the pulse sequences, with a phase shifted by 180° from its initial phase in a third quarter of the pulse sequences and with a phase shifted by 270° from its initial phase in a fourth quarter of the pulse sequences, the arrangement being such that a pulse sequence exists with each permutation of permitted phase possibilities for each of the said localization pulses with each permitted phase possibility for each of the other said localization pulses, characterized in that the said pulse sequences contain at least two of the said excitation pulses of the form A[±x]; (B) first and second pluralities of sequences are applied, each pulse sequence in said first plurality includes an excitation pulse and at least two localization pulses, wherein each localization pulse is of the form A[±x], A[±x,±y], wherein "A" indicates the magnitude of the pulse, the notation [±x] indicates that the corresponding pulse occurs in one half of the corresponding pulse sequences with an initial phase and in the remaining pulse sequences with its phase shifted by 180° with respect to the initial phase, and wherein the notation [±x,±y] indicates that the corresponding pulse occurs within an initial phase in a first quarter of the pulse sequences, with a phase shifted by 90° from its initial phase in a second quarter of the pulse sequences, with a phase shifted by 180° from its initial phase in a third quarter of the pulse sequences and with a phase shifted by 270° from its initial phase in a fourth quarter of the pulse sequences, the arrangement being such that a pulse sequence exists with each permutation of permitted phase possibilities for each pulse of the said localization pulses with each permitted phase possibility for each other said localization pulse, applying to the sample a second plurality of sequences, the second differing from the first plurality by the omission in the sequence of the second plurality of at least one of said localization pulses; and, (C) each pulse sequence includes at least one localization pulse, and a plurality of excitation pulses, the nth excitation pulse having a magnitude of (2n−1) times that of the first excitation pulse;

irradiation means including a radiofrequency irradiation coil adjacent to the sample support means, having an inhomogeneous radiofrequency field in the intended region of the sample;

means for applying the plurality and pluralities of pulse sequences to the coil; and means for detecting an N.M.R. signal from a sample supported by the sample support means;

means for (1) combining the N.M.R. signals obtained from said plurality of sequences according to procedures (A) and (C) above, and for (2) combining the N.M.R. signals obtained from procedure (C) above within each of said first and second pluralities of sequences, and further combining N.M.R. signals obtained from said first and second pluralities of sequences, to produce a localized N.M.R. signal from selected regions of the sample.

23. Apparatus as claimed in claim 22, wherein the irradiation or detection means includes one or more further coils in the region of the sample support.

* * * * *